(12) United States Patent
Maleka et al.

(10) Patent No.: US 11,025,065 B2
(45) Date of Patent: Jun. 1, 2021

(54) OSCILLATIONS IN ELECTRICAL POWER NETWORKS

(71) Applicant: General Electric Technology GmbH, Baden (CH)

(72) Inventors: Kyriaki Maleka, Edinburgh (GB); Oleg Bagleybter, Edinburgh (GB); Natheer Al-Ashwal, Edinburgh (GB); Stuart Clark, Edinburgh (GB); Douglas Wilson, Edinburgh (GB)

(73) Assignee: General Electric Technology GmbH, Baden (CH)

( * ) Notice: Subject to any disclaimer, the term of this patent is extended or adjusted under 35 U.S.C. 154(b) by 277 days.

(21) Appl. No.: 16/072,194

(22) PCT Filed: Jan. 20, 2017

(86) PCT No.: PCT/EP2017/051230
§ 371 (c)(1),
(2) Date: Jul. 24, 2018

(87) PCT Pub. No.: WO2017/129492
PCT Pub. Date: Aug. 3, 2017

(65) Prior Publication Data
US 2019/0027935 A1   Jan. 24, 2019

(30) Foreign Application Priority Data

Jan. 26, 2016 (GB) ........................................ 1601472

(51) Int. Cl.
*H02J 3/24* (2006.01)
*H02J 3/00* (2006.01)
*G01R 19/25* (2006.01)

(52) U.S. Cl.
CPC ............ *H02J 3/24* (2013.01); *G01R 19/2506* (2013.01); *G01R 19/2513* (2013.01); *H02J 3/00* (2013.01);
(Continued)

(58) Field of Classification Search
CPC .. H02J 3/24; H02J 13/00002; H02J 13/00034; H02J 3/00; G01R 19/2506;
(Continued)

(56) References Cited

U.S. PATENT DOCUMENTS

| 4,795,983 A | * | 1/1989 | Crockett | ............... G01R 27/18 |
| | | | | 324/521 |
| 6,104,182 A | * | 8/2000 | Jurisch | ...................... H02J 3/24 |
| | | | | 324/140 R |
| 6,756,702 B1 | * | 6/2004 | Kalman | .................. H02M 1/12 |
| | | | | 307/125 |
| 2007/0005194 A1 | * | 1/2007 | Chang | ............... G01R 19/2513 |
| | | | | 700/292 |

(Continued)

FOREIGN PATENT DOCUMENTS

| JP | H0731198 A | 1/1995 |
| JP | H09233734 A | 9/1997 |

(Continued)

OTHER PUBLICATIONS

Collier et al., "AC currents synchronization technique based on the normalized phase-locked loop for modulation of a three-phase PWM delta-switch rectifier," 2014 IEEE 15th Workshop on Control and Modeling for Power Electronics (COMPEL), Santander, 2014, pp. 1-7, doi: 10.1109/COMPEL.2014.6877131. (Year: 2014).*

*Primary Examiner* — Gregory J Toatley, Jr.
*Assistant Examiner* — Lyudmila Zaykova-Feldman
(74) *Attorney, Agent, or Firm* — Fitch Even Tabin & Flannery LLP

(57) ABSTRACT

The present invention relates to a method of monitoring oscillations that are liable to interact in an electrical power network, in dependence on measurement of AC waveforms in the electrical power network. The method comprises (Continued)

receiving first waveform data corresponding to an electrical quantity in each phase of at least two phases of three-phase AC waveforms at a location in the electrical power network. The method further comprises applying a transformation to the first waveform data to provide therefrom second waveform data corresponding to an electrical quantity at the location in a single phase representation, the second waveform data depending on the at least two phases.

31 Claims, 7 Drawing Sheets

(52) U.S. Cl.
CPC ........... *G01R 19/2509* (2013.01); *Y02E 60/00* (2013.01); *Y04S 10/30* (2013.01)

(58) Field of Classification Search
CPC . G01R 19/2513; G01R 19/2509; Y02E 60/74; Y04S 10/30
See application file for complete search history.

(56) References Cited

U.S. PATENT DOCUMENTS

| | | | | |
|---|---|---|---|---|
| 2011/0285362 | A1* | 11/2011 | Huomo | H02M 1/4208 |
| | | | | 323/205 |
| 2012/0314466 | A1* | 12/2012 | Goerges | H02M 7/53873 |
| | | | | 363/78 |
| 2013/0176751 | A1* | 7/2013 | Olea | H02J 3/1842 |
| | | | | 363/16 |
| 2015/0102689 | A1* | 4/2015 | Persson | H02J 3/1842 |
| | | | | 307/105 |
| 2016/0248358 | A1* | 8/2016 | Maloum | H02P 21/05 |
| 2016/0334447 | A1* | 11/2016 | Parashar | G01R 31/40 |
| 2017/0170763 | A1* | 6/2017 | Blackwelder | H02P 5/74 |
| 2017/0353036 | A1* | 12/2017 | Gil Lizarbe | H02J 3/381 |

FOREIGN PATENT DOCUMENTS

| | | |
|---|---|---|
| JP | 2009133808 A | 6/2009 |
| JP | 2010016990 A | 1/2010 |
| JP | 2013099065 A | 5/2013 |
| JP | 2015210265 A | 11/2015 |
| NO | 2008146358 A | 12/2008 |
| NO | 2014010030 A | 1/2014 |

* cited by examiner

OSCILLATIONS IN ELECTRICAL POWER NETWORKS

FIELD OF THE INVENTION

The present invention relates to a method of monitoring oscillations that are liable to interact in an electrical power network, in dependence on measurement of AC waveforms. The present invention also relates to apparatus for monitoring oscillations that are liable to interact in an electrical power network, in dependence on measurement of AC waveforms. The present invention also relates to a method of displaying data representing behaviour of an electrical power network and apparatus therefor.

BACKGROUND OF THE INVENTION

Sub-synchronous oscillations (SSO) are known in electrical power networks as are problems arising from SSO where these interact to form large poorly or negatively damped oscillations which are liable to cause damage. The problems arise from interaction, i.e. resonance, between SSO natural frequencies. Four different forms of resonance have been identified. Firstly, sub-synchronous resonance (SSR) which is interaction between generator shaft torsional oscillations and the natural frequency of series compensated transmission lines. Secondly, sub-synchronous torsional interaction (SSTI) which is interaction between generator shaft torsional oscillations and other equipment connected to the network and in particular power electronics including HVDC converters, static VAR compensators (SVCs) and flexible alternating current transmission systems (FACTS). Thirdly, sub-synchronous control interaction (SSCI) which is interaction between series compensation and control systems of equipment connected to the network and in particular fast acting power electronic controls of wind farms, HVDC terminals, SVCs and FACTS. Fourthly, the induction generator effect involves interaction of induction motor loads with other network natural frequencies. It can therefore be appreciated that SSO problems can arise from one or more of many different elements within an electrical power network with each electrical power network having its own particular configuration of potentially contributing elements.

It is known to address the above problems by one or more of: model based network planning which is intended to avoid coincidence of SSO natural frequencies; SSR protection in the form of tripping apparatus which is operative in dependence on the presence of large amplitude oscillations; and damping control loops which are used with susceptible equipment such as thyristor controlled series compensation (TCSC). The increase in renewable generation and its inherently intermittent nature and the increasing use of power electronic conversion is tending to make the first model based planning approach complex and uncertain. SSR protection has the disadvantage of tripping electrical power network apparatus and thereby causing undesirable disturbance. Damping control loops have the disadvantage of addressing a few only of the electrical power network elements that can cause problematic SSO interactions.

In view of the above mentioned shortcomings of known approaches to addressing SSO problems the present inventors have become appreciative of the value of an approach to identifying the development of a resonant condition before it grows to large amplitude whereby action can be taken before problems develop. Furthermore the present inventors have become appreciative of the value of an approach which does not depend on data from a model of the network.

It is therefore an object for the present invention to provide an improved method of monitoring oscillations that are liable to interact in an electrical power network, in dependence on measurement of AC waveforms, whereby a potentially adverse resonant condition in the electrical power network can be addressed or forestalled.

It is a further object for the present invention to provide an improved apparatus for monitoring oscillations that are liable to interact in an electrical power network, in dependence on measurement of AC waveforms, whereby a potentially adverse resonant condition in the electrical power network can be addressed or forestalled.

SUMMARY OF INVENTION

According to a first aspect of the present invention there is provided a method of monitoring oscillations that are liable to interact in an electrical power network, in dependence on measurement of AC waveforms in the electrical power network, the method comprising:

a. receiving first waveform data corresponding to an electrical quantity in each phase of at least two phases of three-phase AC waveforms at a location in the electrical power network; and b. applying a transformation to the first waveform data to provide therefrom second waveform data corresponding to an electrical quantity in a single phase representation at the location, the second waveform data depending on the at least two phases.

The method according to the present invention relates to monitoring oscillations that are liable to interact in an electrical power network, in dependence on measurement of AC waveforms in the electrical power network. Such oscillations may result in a potentially adverse resonant condition in the electrical power network. Oscillations observed in AC waveforms may reflect interaction between plants, i.e. resonance, or precursor oscillations. Such oscillations are of a frequency other than a fundamental frequency such as 50 Hz or 60 Hz. A potentially adverse resonant condition in the electrical power network can therefore be addressed or forestalled.

The method comprises receiving first waveform data corresponding to an electrical quantity in each phase of at least two phases of three-phase AC waveforms at a location in the electrical power network. The method further comprises applying a transformation to the first waveform data to provide therefrom second waveform data corresponding to an electrical quantity in a single phase representation at the location, the second waveform data depending on the at least two phases. The location may be one of plural such locations which are spaced apart from each other with the method according to the invention being practiced separately in respect of first waveform data received from each of the plural locations. The method may therefore be practiced in each of plural apparatus, each of the plural apparatus being at or near a respective one of the plural locations. A transformation is applied to the first waveform data to provide therefrom second waveform data corresponding to an electrical quantity in a single phase representation at each of the plural spaced apart locations, the second waveform data depending on the at least two phases.

As described further below, the method according to the invention may comprise receiving first waveform data which is continually streamed from the location. Furthermore measurement at the location to provide the first waveform data may be at a high rate compared, for example, with the rate at which measurements are provided by a standard Phasor Measurement Unit (PMU). Consequently there may be a considerable volume of first waveform data for onward transmission and subsequent processing. Such volume of waveform data may either be too great to be accommodated by the onward transmission communication channel or be subject to limited bandwidth of the onward transmission communication channel and thereby militate against timely processing of the first waveform data after onward transmission whereby there is a reduction in utility in respect of identifying potentially adverse resonant conditions in the electrical power network. Application of the transformation according to the method of the invention to provide second waveform data has been found to reduce the data volume whereby onward transmission of the second waveform data is more readily accomplished. The method may therefore be practiced at or near where AC measurement is made.

Alternatively the method may be practiced in a place other than at or near where AC measurement is made. For example, the method may be practiced at a central location such as in a control room. The step of applying a transformation to the first waveform data to provide therefrom second waveform data corresponding to an electrical quantity in a single phase representation at the location may provide for reduction of data for the like of simpler or more ready visualisation or more compact storage.

As described above, the transformation is applied to the first waveform data to provide therefrom second waveform data corresponding to an electrical quantity in a single phase representation at the location, the second waveform data depending on the at least two phases. The transformation may be a real transformation. The transformation may be operative to project the at least two phase data from a three-phase coordinate system onto a two axes reference frame. More specifically the transformation may be operative to project the at least two phase waveform data and more specifically three phase waveform data onto a stationary two axes reference frame. The transformation may therefore be the Clarke transformation. Contrary to expectations, application of the transformation according to the present invention may result in retention of effective observability in the second waveform data of the at least two phases of the three-phase waveforms whereby oscillations that are liable to result in a resonant condition in the electrical power network may be detected.

The step of receiving first waveform data may comprise receiving first waveform data corresponding to an electrical quantity in each phase of three phases of three-phase AC waveforms at the location in the electrical power network. The transformation may therefore be operative on first waveform data corresponding to an electrical quantity in each phase of three phases to provide second waveform data corresponding to an electrical quantity in one phase only. In certain circumstances the step of receiving first waveform data may comprise receiving first waveform data corresponding to an electrical quantity in each phase of two phases of two-phase AC waveforms at the location in the electrical power network. For example two-phase AC waveforms may be involved in railway traction.

Where the transformation is the Clarke transformation and two phases are subject to transformation, the transformation may have the form:

$$D_\beta(t) = \frac{2}{3} \begin{bmatrix} \frac{\sqrt{3}}{2} & -\frac{\sqrt{3}}{2} \end{bmatrix} \begin{bmatrix} D_a(t) \\ D_b(t) \end{bmatrix} \quad (1)$$

where D is either current (i.e. i) where current is measured or voltage (i.e. v) where voltage is measured. The above transformation is the β transformation. The above transformation applies where phases a and b are transformed. Where phases b and c or phases c and a are transformed the latter part of the matrix multiplication is respectively:

$$\begin{bmatrix} D_b(t) \\ D_c(t) \end{bmatrix} \begin{bmatrix} D_c(t) \\ D_a(t) \end{bmatrix}$$

Where the first waveform data corresponds to only one phase, the method may be operative such that the second waveform data corresponds to the first waveform data, i.e. there is no transformation of the first waveform data.

Where the transformation is the Clarke transformation and three phases are subject to transformation, the transformation may have the form:

$$D_\alpha(t) = \frac{2}{3} \begin{bmatrix} 1 & -\frac{1}{2} & -\frac{1}{2} \end{bmatrix} \begin{bmatrix} D_a(t) \\ D_b(t) \\ D_c(t) \end{bmatrix} \quad (2)$$

where D is either current (i.e. i) where current is measured or voltage (i.e. v) where voltage is measured. The above transformation is the α transformation.

The Clarke transformation may offer the advantage over other transformations of being operative irrespective of whether electrical quantities in two phases are being transformed or electrical quantities in three phases are being transformed. An electrical quantity may be lacking or may be disregarded on account of a measurement interruption. A measurement interruption may take the form of a fault, such as might be caused by an electrical conductor arcing to a branch of a tree or by lightning, and is typically of shorter duration. Alternatively a measurement interruption may take the form of failure of apparatus, such as of measurement apparatus, and is typically of longer duration. Measurement apparatus failure may comprise failure of a current transformer, a voltage transformer or local communication apparatus. The method therefore may further comprise determining whether or not there is a measurement interruption. Determining whether or not there is a measurement interruption may comprise determining a peak value for each of at least one phase of AC waveforms. The peak value may be of the fundamental AC waveform over a cycle. The peak value may be determined in dependence on the first waveform data. Determining a peak value may comprise filtering the first waveform data. Filtering may be over at least one cycle of the AC waveform and more specifically over plural cycles of the AC waveform.

According to a first approach, the method may comprise determining whether or not there is a fault condition reflected in the first waveform data. Determining whether or not there is a fault condition may comprise determining whether or not there is an asymmetric fault condition and more specifically determining whether or not there is an asymmetric fault condition only of an asymmetric fault condition and a symmetric fault condition. There may be similarity in behaviour of the electrical power network between a symmetric fault condition and early stage sub-synchronous resonance in respect of the voltages of all three phases dropping to close to zero. Hence an asymmetric fault condition only may be determined.

Determining whether or not there is a fault condition may further comprise determining whether or not a phase is faulty. Determining whether or not a phase is faulty may comprise determining if the peak value for each of the at least two phases of three-phase AC waveforms has changed by more than a predetermined amount over a predetermined period. The predetermined amount may be a percentage of a nominal electrical quantity of the AC waveform. The predetermined period may be a cycle of the AC waveform. Where the AC waveform is voltage the change in the peak value of the electrical quantity may be a reduction in voltage. Where the AC waveform is current the change in the in the peak value of the electrical quantity may be an increase in current.

Alternatively or in addition, determining whether or not there is a fault condition may further comprise determining whether or not plural phases are unbalanced. Determining whether or not plural phases are unbalanced may comprise determining whether or not a difference between a maximum peak value of the plural phases and a minimum peak value of the plural phases is greater than a predetermined value. The predetermined value may be a percentage of a nominal electrical quantity of the AC waveform. Phase imbalance may be determined in respect of at least one of voltage and current.

The method may further comprise generating a fault condition signal in dependence on determination of there being a fault condition. Generating a fault condition signal may comprise changing a status of at least one flag associated with measurement samples. The fault condition signal may be generated where there is a fault condition in respect of at least one phase and more specifically at least two phases. The fault condition signal may be generated for a predetermined period. The predetermined period may be set in dependence on the time taken to clear a fault causing the fault condition, such as a branch of a tree touching a line. For example the predetermined period may be set at 200 ms in view of the majority of faults being cleared in less than this period.

A determination that there is a fault condition may depend on a determination that a phase is faulty and a determination that plural phases are unbalanced. First waveform data received upon initial operation according to the method, such as upon initialisation of apparatus operating according to the method, may be disregarded in respect of determining whether or not there is a fault condition.

According to a second approach, the method may comprise determining whether or not there is a failure condition reflected in the first waveform data. In a form, the invention may involve both the first and second approaches whereby the method comprises determining whether or not there is a fault condition and whether or not there is a failure condition.

Determining whether or not there is a failure condition may comprise determining whether or not there is a low peak electrical quantity. Determining whether or not there is a low peak electrical quantity may comprise determining whether or not the peak value, such as of voltage or current, is greater than a predetermined value. The predetermined value may be a percentage of a nominal electrical value. Determination of a low peak electrical quantity may be in dependence on the peak value being less than the predetermined value. As mentioned above, failure condition may arise from failure of measurement apparatus, such as of a voltage transformer or of a current transformer. A determination that there has been failure of measurement apparatus may comprise making a determination that there is a low peak electrical quantity in respect of at least one phase. More specifically a determination that there has been failure of measurement apparatus may comprise making a determination that there is a low peak electrical quantity in respect of one of one phase only and two phases only.

Alternatively or in addition whether or not there is a failure condition may comprise determining whether or not plural phases are unbalanced as described above with reference to the first approach.

A determination that there is a failure condition may depend on a determination that there is a low peak electrical quantity and a determination that plural phases are unbalanced. A failure condition may be sustained for longer than a fault condition, such as for longer than 200 ms.

A failure condition signal may be generated in dependence on a determination of a failure condition. More specifically the failure condition signal may be generated when the determination persists for at least two cycles of the AC waveform. A problem, such as unnecessary phase switching during subsequent processing, which arises on account of a transient low electrical quantity may be avoided thereby. Generating a failure condition signal may comprise changing a status of at least one flag associated with measurement samples.

Measurement apparatus may recover following failure. A measured signal may require time to reach steady state during recovery. Following recovery of failed measurement apparatus there may be a delay of a predetermined period before application of the transformation to the first waveform data. The predetermined period may, for example, be three cycles of the AC waveform. Providing such a delay may reduce the likelihood of discontinuities in data following subsequent processing.

The step of receiving first waveform data may comprise receiving the first waveform data at each of plural spaced apart locations in the electrical power network. The method may thus be operative on waveform data received from plural different spaced apart locations. Wide area observability may therefore be achieved. The step of applying a transformation may comprise applying a transformation to the first waveform data to provide therefrom second waveform data corresponding to an electrical quantity in a single phase representation at each of the plural spaced apart locations. The method may thus involve applying the transformation in respect of data from each of the plural different locations. As described above, the transformation may be applied at at least one of locally to a measurement location and remote from a measurement location, such as in a control room. Where the transformation is applied locally to a measurement location, the transformation may be applied to first waveform data from a first measurement location at a second measurement location after the first waveform data from the first measurement location has been conveyed to the second measurement location.

The method may further comprise processing the second waveform data to characterise behaviour of the electrical power network. Processing may comprise monitoring behaviour of the electrical power network over time and on an on-going basis. Alternatively or in addition processing may comprise conducting an historical study in dependence on stored second waveform data.

Processing may provide for identification of an interaction between two or more systems each having modes of oscillation which interact through the electrical power network to form resonance. The processing may be in dependence on comparison of time-varying data received from measurement of different electrical quantities at plural locations in the electrical power network. The processing step may be carried out at a location spaced apart from a location in respect of which first waveform data is received. The processing step may be carried out at a central location, the transformation being applied at at least one distributed location or at the central location. Alternatively or in addition and where the steps of receiving first waveform data and applying a transformation are performed at each of plural locations, the processing may be carried out at one of the plural locations.

The method may comprise measuring waveforms at the location in the electrical power network. The first waveform data may correspond to the measurements. The first waveform data may comprise at least one of voltage data and current data. The method may therefore comprise measuring at least one of voltage and current at the location. The method may comprise applying an anti-aliasing filter to the measurements.

The method may comprise sampling the electrical quantity at a sufficient rate such that the first waveform data comprises oscillations up to no more than 240 Hz or 200 Hz and more specifically no more than 120 Hz, 100 Hz, 60 Hz or 50 Hz. In a form, the method may comprise sampling the electrical quantity at least twice and more specifically four times per cycle of the AC waveform and more specifically at least twice and more specifically four times per cycle of the fundamental frequency of the electrical power network. The electrical quantity may, for example, be sampled at a rate of 200 Hz and 240 Hz for fundamental frequencies of 50 Hz and 60 Hz respectively. Sampling in such a fashion may provide for determination of SSO in the range of 4 Hz to 46 Hz for a 50 Hz fundamental frequency or 4 to 56 Hz for a 60 Hz fundamental frequency.

In a form, the electrical quantity may be acquired at a sample rate much in excess of the above described rates. The method may therefore comprise down-sampling from the acquired sample rate to the above described rates. The electrical quantity may be acquired at a sample rate of at least 1 kHz, 3 kHz, 5 kHz or 10 kHz. The method may be operative in respect of frequencies of oscillation below fundamental frequency, for example below 50 Hz or 60 Hz. Alternatively or in addition, the method may be operative in respect of frequencies of oscillation other than in the range of 0.002 Hz to 4 Hz. The method may therefore not be responsive to electromechanical oscillations and governor control modes.

The method may further comprise determining a time of acquisition of each sample of the electrical quantity. The method may therefore comprise receiving a time of acquisition for each sample of the electrical quantity. The method may thereafter comprise aligning plural sets of data with each other in respect of time in dependence on the received acquisition times. Aligning of plural sets of data may be carried out at a location spaced apart from the location of the three-phase AC waveforms, such as at a central location. Time alignment may be carried out before displaying of data in dependence on the second waveform data as described further below.

The method may further comprise determining time-varying data in dependence on the second waveform data. The time-varying data may correspond to at least one of frequency, amplitude and damping of oscillations. Such determined quantities and characteristics may be displayed to a user as described below whereby the user can determine the like of: relative areas of contribution; where a problem originates in the electrical network; and where a problem is propagating in the electrical network.

The method may further comprise determining a spectrogram based on the second waveform data. The spectrogram may have a bandwidth in accordance with the sampling rates described above. The method may further comprise displaying the spectrogram, such as on a video display unit or in the form of hardcopy. A user may therefore be able to determine whether an observed oscillation mode is a modulation of the AC waveform or a superimposed frequency component to thereby aid the user's interpretation of network behaviour.

The method may further comprise receiving speed data, for example corresponding to the rotational speed of a rotational machine, such as a generator, measured at a location in the electrical power network. The method may yet further comprise processing generator rotor speed data to derive at least one time-varying characteristic of the electrical power network, the at least one time-varying characteristic being received together with time-varying data based on the second waveform data. Generator rotor speed data may be conveyed, such as to a central location, for processing and display, for example, with data based on the second waveform data. Further signals may be of value in characterising behaviour of the electrical power network. The method may therefore further comprise receiving data in respect of the like of vibration, DC power and control. Such data may be processed, such as in respect of display to a user, in conjunction with data based on the second waveform data.

The method may comprise displaying data in dependence on the second waveform data. The first waveform data may correspond to plural different types of signal, such as current and voltage, at the location. As described above generator rotor speed data and perhaps also further forms of data may be received. The generator rotor speed data and perhaps also the further forms of data may be displayed. Different types of signal for display may comprise at least two of voltage, current and generator rotor speed. The method may further comprise prioritising at least one of the different types of signal over another of the different types of signal. Furthermore the method may comprise displaying data corresponding to or based on a prioritised type of signal in preference to another type of signal. The displayed data may correspond to at least one of: prioritised second waveform data; and prioritised time-varying data.

Where at least one signal is received from each of plural different spaced apart locations in the electrical power network, the method may comprise determining the oscillation of largest amplitude comprised in the received signals. The method may further comprise setting a threshold value in dependence on user operation and comparing the oscillation of largest amplitude with the threshold value. Thereafter the method may comprise one of: setting a normalisation amplitude as the oscillation of largest amplitude where the oscillation of largest amplitude is greater than the threshold value; and setting a normalisation amplitude as the threshold value where the oscillation of largest amplitude is less than the threshold value. The method may further comprise normalising the amplitude of the oscillation component of each of the plural received signals to the normalisation amplitude; and displaying data corresponding to the normalised amplitudes.

Where a type of signal is received from each of plural different spaced apart locations in the electrical power network, the received signals represent oscillatory behaviour and the electrical power network has a fundamental frequency, the method may comprise determining a complement for at least one frequency of oscillation other than the fundamental frequency comprised in each received signal, the complement being one of: the fundamental frequency plus the frequency of oscillation; and the fundamental frequency minus the frequency of oscillation. The method may further comprise displaying data corresponding to the at least one complement.

According to a second aspect of the present invention there is provided a computer program comprising program instructions for causing a computer to perform the method according to the first aspect of the present invention. More specifically the computer program may be one of: embodied on a record medium; embodied in a read only memory; stored in a computer memory; and carried on an electrical carrier signal. Further embodiments of the second aspect of the present invention may comprise one or more features of the first aspect of the present invention.

According to a third aspect of the present invention there is provided apparatus for monitoring oscillations that are liable to interact in an electrical power network, in dependence on measurement of AC waveforms in the electrical power network, the apparatus comprising a processor which is operative: to receive first waveform data corresponding to an electrical quantity in each phase of at least two phases of three-phase AC waveforms at a location in the electrical power network; and to apply a transformation to the first waveform data to provide therefrom second waveform data corresponding to an electrical quantity in a single phase representation at the location, the second waveform data depending on the at least two phases.

The apparatus for monitoring may further comprise measurement apparatus which is operative to measure each phase of at least two phases of three-phase AC waveforms at the location in the electrical power network, the first waveform data corresponding to the measurements made by the measurement apparatus. The apparatus for monitoring may be configured to sample measurements made by the measurement apparatus. Sampling may be at a rate of at least one, two or three samples per cycle of the AC waveform. More specifically sampling may be at a rate of four samples per cycle of the AC waveform. Therefore in a 50 Hz electrical power network the sampling may be at 200 Hz. The measurement apparatus may, therefore, be configured to make measurements at a higher rate, such as 12.8 kHz.

The measurement apparatus may be operative to measure at least one of current and voltage signals. The measurement apparatus therefore may comprise at least one of a voltage transformer and a current transformer. Alternatively or in addition, the measurement apparatus may be operative to measure speed and more specifically speed of rotation of a rotating part such as a generator shaft. Speed measurement apparatus may comprise the like of a toothed wheel probe transducer or a zebra tape measurement arrangement. Speed measurement apparatus may comprise a pulse width counter which is operative to convert pulse train measurements to an analogue signal corresponding to the pulse frequency. Thereafter the analogue signal may be converted to digital form by way of known analogue to digital conversion apparatus.

Further embodiments of the third aspect of the present invention may comprise one or more features of the first aspect of the present invention.

According to a further aspect of the present invention there is provided a method of monitoring oscillations that are liable to interact in an electrical power network, in dependence on measurement of AC waveforms in the electrical power network, the method comprising: receiving first data corresponding to an electrical quantity in each phase of at least two phases of three-phase AC waveforms at a location in the electrical power network; and applying a transformation to the first data to provide therefrom second data corresponding to an electrical quantity in a single phase representation at the location. Embodiments of the further aspect of the present invention may comprise one or more features of any previous aspect of the present invention.

According to a yet further aspect of the present invention there is provided a method of detecting a fault affecting operation of an electrical power network, in dependence on measurement of AC waveforms in the electrical power network, the method comprising:

determining a peak value for each of at least two phases of the three-phase AC waveforms;

determining if the peak value for each of the at least two phases has changed by more than a predetermined amount over a predetermined period;

determining whether or not a difference between a maximum peak value of the plural phases and a minimum peak value of the plural phases is greater than a predetermined value; and detecting a fault in dependence on said determinations.

A fault may, for example, be caused by an electrical conductor arcing to a branch of a tree. The method comprises determining a peak value for each of at least two phases of three-phase AC waveforms measured in the electrical power network. The method also comprises determining whether or not a phase is faulty by determining if the peak value for each of the at least two phases has changed by more than a predetermined amount over a predetermined period. The method further comprises determining whether or not plural phases are unbalanced by determining whether or not a difference between a maximum peak value of the plural phases and a minimum peak value of the plural phases is greater than a predetermined value. The method yet further comprises detecting a fault in dependence on determining whether or not a phase is faulty and determining whether or not plural phases are unbalanced.

Embodiments of the yet further aspect of the present invention may comprise one or more features of any other aspect of the present invention.

The present inventors have appreciated that the features of prioritising at least one of plural different types of signal and displaying data in dependence on prioritising are of wider applicability than hitherto described. Therefore and according to a fourth aspect of the present invention there is provided a method of displaying data representing behaviour of an electrical power network, the method comprising:

receiving from each of plural different spaced apart locations in an electrical power network plural different types of signal each representing behaviour at the location, the plural different types of signal comprising at least two of voltage, current and speed;

prioritising at least one of the plural different types of signal over another of the plural different types of signal; and displaying data corresponding to or based on a prioritised type of signal in preference to another type of signal.

The method of displaying data representing behaviour of an electrical power network comprises receiving from each of plural different spaced apart locations in an electrical power network plural different types of signal each representing behaviour and more specifically behaviour at the location of at least one of the electrical power network and machines, such as generators, connected to the electrical power network. The signal may characterise oscillatory behaviour at the location. The received plural different types of signal comprise at least two of voltage, current and speed. The method further comprises prioritising at least one of the plural different types of signal over another of the plural different types of signal, such as speed over voltage. The method yet further comprises displaying data corresponding to or based on a prioritised type of signal in preference to another type of signal. Data corresponding to or based on a prioritised type of signal may be displayed in preference to another type of signal in respect of each of the plural locations. Known methods of displaying data representing behaviour of an electrical power network receive and display one type of signal only, such as the fundamental frequency. The method of the present invention may provide for preferential display of data which may yield more information than data corresponding to or based on another type of signal when seen by a user.

The plural different types of signal may each characterise oscillatory behaviour at a location. For example the plural different types of signal may comprise oscillation in speed, oscillation in voltage and oscillation in current. The signals received from the plural different locations may comprise oscillations having a frequency between 4 Hz and 46 Hz in a 50 Hz system or 4 to 56 Hz in a 60 Hz system. In certain circumstances the different types of signal may be limited. Thus, for example, only voltage and current of voltage, current and speed may be received in respect of at least one location. A speed signal may be accorded higher priority than a voltage signal. Alternatively or in addition, a voltage signal may be accorded higher priority than a current signal.

The step of displaying data corresponding to or based on a prioritised type of signal in preference to another type of signal may comprise displaying data corresponding to or based on the prioritised type of signal only of the plural different types of signal. Alternatively or in addition, such as in respect of a subset of locations only, data corresponding to or based on the prioritised type of signal may be displayed more prominently than data corresponding to another type of signal.

The same at least one of the plural different types of signal may be prioritised over another of the plural different types of signal in respect of all of the plural different spaced apart locations. A user may therefore be able to compare like for like in respect of type of signal across the electrical power network. For example the user may compare relative amplitude of a specific frequency of oscillation at different locations in respect of the same signal type. Alternatively or in addition, the different types of signal may be prioritised at different locations. For example, a first same at least one of the plural different types of signal may be prioritised for a first area in the electrical power network and a second same at least one of the plural different types of signal may be prioritised for a second area in the electrical power network. A user may therefore be able to compare like for like in respect of type of signal in the first area and be able to compare a different like for like in respect of type of signal in the second area. Such an approach may be useful to the user depending on the configuration of the electrical power network and present behaviour in the electrical power network.

Ease of visual perception may be of value to a user in particular where the user is viewing data in respect of signals from a large number of locations in the electrical power network. Data corresponding to or based on a signal therefore may be displayed in other than numerical form. Data corresponding to or based on a signal may be displayed as a symbolic arrangement. More specifically a dimension of the symbolic arrangement may be proportional to an amplitude of oscillation of the signal. Data corresponding to or based on a signal may be displayed in graphical form, such as a bar with a length of the bar being proportional to amplitude, such as amplitude of oscillation of the signal. Ease of visual distinction of data in respect of different types of signal may be of value to a user. Data corresponding to or based on different types of signal may therefore be displayed in different forms. More specifically data corresponding to or based on different types of signal may be displayed in different colours.

The method may comprise determining an oscillation of largest amplitude at a location. More specifically the method may comprise displaying data corresponding to the oscillation of largest amplitude at a location. Plural signals of the same type, such as voltage, may be received from a location, one of the plural signals having the largest oscillation may be determined and data corresponding to the largest oscillation may be displayed.

It may be useful to a user to have his attention drawn to a subset of all of the plural different locations at which signals of greater amplitude and more specifically oscillations of greater amplitude, are present. The method may therefore comprise comparing an amplitude of oscillation with a threshold value and if the amplitude of oscillation is greater than the threshold value displaying data corresponding to the amplitude of oscillation. The amplitude of oscillation may be compared with the threshold value. At least one of the configuration and behaviour of the electrical power network may change over time. Changing the threshold value therefore may be useful to the user. Furthermore and where the configuration and behaviour of the electrical power network are substantially unchanging, changing the threshold value may allow the user to form an improved view as to the behaviour of the electrical power network by, for example, allowing the user to view behaviour at a larger subset of locations which are exhibiting moderate oscillatory behaviour before viewing behaviour at a smaller subset of locations which are exhibiting more extreme oscillatory behaviour. The method may therefore comprise changing the threshold value in dependence on user operation.

The steps of receiving plural different types of signal and prioritising at least one of the plural different types of signal may be carried out on a processor. The processor may be located at a central location. The central location may be remote from the plural different locations. The central location may, for example, be in a control room. The step of displaying data corresponding to a prioritised type of signal in preference to another type of signal may comprise displaying data corresponding to the prioritised type of signal on a video display unit.

The method may further comprise displaying a representation of the electrical power network. The electrical power network may, for example, be displayed in the form of a map which shows natural features of the geographical area of the electrical power network. The representation of the electrical power network may display the relative positions of the plural locations from which the plural different types of signal are received.

Irrespective of the display of data corresponding to signals as described above, all received signals may be stored for the purpose of later reporting or analysis. The method may therefore comprise storing in data storage at least one of: signals received from the plural different locations; and data based on such signals.

Further embodiments of the fourth aspect of the present invention may comprise one or more features of any previous aspect of the present invention and vice-versa.

According to a fifth aspect of the present invention there is provided a computer program comprising program instructions for causing a computer to perform the method according to the fourth aspect of the present invention. More specifically the computer program may be one of: embodied on a record medium; embodied in a read only memory; stored in a computer memory; and carried on an electrical carrier signal. Further embodiments of the fifth aspect of the present invention may comprise one or more features of any previous aspect of the present invention and vice-versa.

According to a sixth aspect of the present invention there is provided apparatus for displaying data representing behaviour of an electrical power network, the apparatus comprising:

a processor configured: to receive from each of plural different spaced apart locations in an electrical power network plural different types of signal each representing behaviour at the location, the plural different types of signal comprising at least two of voltage, current and speed; and to prioritise at least one of the plural different types of signal over another of the plural different types of signal; and display apparatus operative to display data corresponding to or based on a prioritised type of signal in preference to another type of signal.

The display apparatus may comprise a video display unit. The display apparatus may be comprised in computing apparatus, such as a workstation or Personal Computer. The processor may be comprised in computing apparatus, such as a server arrangement and perhaps a server arrangement configured for redundancy.

Further embodiments of the sixth aspect of the present invention may comprise one or more features of any previous aspect of the present invention and vice-versa.

Where at least one signal is received from each of plural different spaced apart locations in the electrical power network, the method may comprise determining the oscillation of largest amplitude comprised in the received signals. The method may further comprise setting a threshold value in dependence on user operation and comparing the oscillation of largest amplitude with the threshold value. Thereafter the method may comprise one of: setting a normalisation amplitude as the oscillation of largest amplitude where the oscillation of largest amplitude is greater than the threshold value; and setting a normalisation amplitude as the threshold value where the oscillation of largest amplitude is less than the threshold value. The method may further comprise normalising the amplitude of the oscillation component of each of the plural received signals to the normalisation amplitude; and displaying data corresponding to the normalised amplitudes.

The present inventors have appreciated that the features of a user settable threshold value and normalisation of amplitude of oscillation in dependence on the user settable threshold value are of wider applicability than hitherto described. Therefore and according to a seventh aspect of the present invention there is provided a method of displaying data representing behaviour of an electrical power network, the method comprising:

determining the oscillation of largest amplitude of plural signals, each of the plural signals being received from a different one of plural different spaced apart locations in an electrical power network, each signal representing behaviour at the location;

setting a threshold value in dependence on user operation;

comparing the amplitude of the determined oscillation with the threshold value;

one of: setting a normalisation amplitude as the amplitude of the determined oscillation where the amplitude of the determined oscillation is greater than the threshold value; and setting a normalisation amplitude as the amplitude of the threshold value where the amplitude of the determined oscillation is less than the threshold value;

normalising oscillation in each of the plural received signals to the normalisation amplitude; and displaying data corresponding to the normalised plural oscillations.

The method of displaying data representing behaviour of an electrical power network comprises receiving at least one signal from each of plural different spaced apart locations in an electrical power network. The at least one signal represents behaviour at the location. The signal may characterise oscillatory behaviour at the location. The signal may comprise oscillation in one of an electrical signal and a mechanical signal. The method also comprises determining the oscillation of largest amplitude of the plural received signals and setting a threshold value in dependence on user operation. The method further comprises comparing the amplitude of the determined oscillation with the threshold value. The method yet further comprises one of: setting a normalisation amplitude as the amplitude of the determined oscillation where the amplitude of the determined oscillation is greater than the threshold value; and setting a normalisation amplitude as the amplitude of the threshold value where the amplitude of the determined oscillation is less than the threshold value. Thereafter oscillation in each of the plural received signals is normalised to the normalisation amplitude and data corresponding to the normalised plural oscillations are displayed. The capability to set the threshold value in dependence on user operation may provide for oscillations of smaller amplitude not appearing unduly significant when displayed.

The method may further comprise one of: setting the normalisation amplitude as the amplitude of the determined oscillation where the amplitude of the determined oscillation is the same as the threshold value; and setting the normalisation amplitude as the amplitude of the threshold value where the amplitude of the determined oscillation is the same as the threshold value.

Further embodiments of the seventh aspect of the present invention may comprise one or more features of any previous aspect of the present invention and vice-versa.

According to an eighth aspect of the present invention there is provided a computer program comprising program instructions for causing a computer to perform the method according to the seventh aspect of the present invention. More specifically the computer program may be one of: embodied on a record medium; embodied in a read only memory; stored in a computer memory; and carried on an electrical carrier signal. Further embodiments of the eighth aspect of the present invention may comprise one or more features of any previous aspect of the present invention and vice-versa.

According to a ninth aspect of the present invention there is provided apparatus for displaying data representing behaviour of an electrical power network, the apparatus comprising:

a user operable input which is operable by a user to set a threshold value;

a processor configured: to receive plural signals, each of the plural signals being received from a different one of plural different spaced apart locations in an electrical power network, each signal representing behaviour at the location; to determine the oscillation of largest amplitude of the plural received signals; to compare the amplitude of the determined oscillation with the threshold value; one of: to set a normalisation amplitude as the amplitude of the determined oscillation where the amplitude of the determined oscillation is greater than the threshold value; and to set a normalisation amplitude as the amplitude of the threshold value where the amplitude of the determined oscillation is less than the threshold value; and to normalise each of the plural oscillations to the normalisation amplitude; and display apparatus operative to display data corresponding to the normalised plural oscillations.

Further embodiments of the ninth aspect of the present invention may comprise one or more features of any previous aspect of the present invention.

The present inventors have appreciated the feature of displaying the complement of frequency of oscillation to be of wider applicability than hitherto described. Therefore and according to a tenth aspect of the present invention there is provided a method of displaying data representing behaviour of an electrical power network having a fundamental frequency, the method comprising:

receiving data corresponding to a signal from each of plural spaced apart locations in the electrical power network, each signal representing behaviour at a respective location;

determining at least one frequency of oscillation in each signal, the at least one frequency of oscillation being other than the fundamental frequency;

determining a frequency complement for each determined frequency of oscillation, the frequency complement being one of: the fundamental frequency plus the frequency of oscillation;

and the fundamental frequency minus the frequency of oscillation; and selecting for display data corresponding to one of the frequency complement and the determined frequency of oscillation for each of the determined frequencies of oscillation.

The method of displaying data representing behaviour of an electrical power network comprises receiving data corresponding to a signal from each of plural spaced apart locations in the electrical power network, each signal representing behaviour at a respective location. The method also comprises determining at least one frequency of oscillation in each signal, the at least one frequency of oscillation being other than the fundamental frequency of the electrical power network. The frequency of oscillation may, for example, be oscillation in voltage or oscillation in speed. The method also comprises determining a frequency complement for each determined frequency of oscillation, the frequency complement being one of: the fundamental frequency plus the frequency of oscillation; and the fundamental frequency minus the frequency of oscillation. In a typical form the frequency complement may be the fundamental frequency minus the frequency of oscillation. Where the signal is an electrical signal, such as voltage, the frequency complement may provide for alignment of oscillation characteristics derived from the electrical signal with a same mode of oscillation in a measured mechanical signal. Alignment of oscillation characteristics may provide for ease of identification of the like of an interaction between a generator torsional oscillation and components in the electrical network. The method therefore further comprises selecting for display data corresponding to one of the frequency complement and the determined frequency of oscillation for each of the determined frequencies of oscillation. The method may comprise selecting data for display in dependence on user operation.

The ability to select for display one of a frequency of oscillation and the complement of the frequency of oscillation for each of the plural frequencies of oscillation at different locations in an electrical power network may be useful to a user in assessing behaviour of the electrical power network and its connected electrical machines, such as generators. More specifically such ability allows the user to compare frequencies of oscillation components that are likely to interact. For example an oscillation in rotor shaft speed is seen in the electrical power network as the difference between the fundamental frequency and the oscillation frequency. Also oscillation in the electrical power network is seen as the difference between the fundamental frequency and the oscillation frequency of electrical machines, such as generators, connected to the electrical power network. Selection for display between electrical and mechanical perspectives in respect of each of the plural locations may provide for ease of detection of possible interactions.

The method may further comprise displaying data based on the signals. Data based on frequency complements and frequencies of oscillation may be displayed at the same time. Alternatively or in addition, data based on frequency complements and frequencies of oscillation may be displayed at different times. The user may, for example, switch between display of frequency complements and frequencies of oscillation when assessing behaviour of the electrical power network.

A signal may be a mechanical signal, such as speed of rotation of a rotating part such as a generator shaft, or an electrical signal, such as voltage or current measured at a location in the electrical power network.

The method may comprise receiving from each of the plural spaced apart locations a first signal representing mechanical behaviour at the location and a second signal representing electrical behaviour at the location. More specifically the method may comprise determining a complement for frequency of oscillation in one of the first and second signals.

The method may further comprise displaying data corresponding to the frequency complements and frequencies of oscillation of the other of the first and second signals that provided the frequency complements. For example, data corresponding to the complement of frequency of mechanical oscillation may be displayed and data corresponding to frequency of electrical oscillation may be displayed together. By way of another example, data corresponding to the complement of frequency of voltage oscillation may be displayed and data corresponding to frequency of mechanical oscillation may be displayed together. Being able to view data corresponding to frequency complements of oscillation frequencies and oscillation frequencies may reveal useful information to a user concerning behaviour of the electrical power network.

Further embodiments of the tenth aspect of the present invention may comprise one or more features of any previous aspect of the present invention and vice-versa.

According to an eleventh aspect of the present invention there is provided a computer program comprising program instructions for causing a computer to perform the method according to the tenth aspect of the present invention. More specifically the computer program may be one of: embodied on a record medium; embodied in a read only memory; stored in a computer memory; and carried on an electrical carrier signal. Further embodiments of the eleventh aspect of the present invention may comprise one or more features of any previous aspect of the present invention and vice-versa.

According to a twelfth aspect of the present invention there is provided apparatus for displaying data representing behaviour of an electrical power network having a fundamental frequency, the apparatus comprising:

a processor configured: to receive data corresponding to a signal from each of plural spaced apart locations in the electrical power network, each signal representing behaviour at a respective location; to determine at least one frequency of oscillation in each signal, the at least one frequency of oscillation being other than the fundamental frequency; to determine a frequency complement for each determined frequency of oscillation, the frequency complement being one of: the fundamental frequency plus the frequency of oscillation; and the fundamental frequency minus the frequency of oscillation; and to select for display data corresponding to one of the frequency complement and the determined frequency of oscillation for each of the determined frequencies of oscillation.

Further embodiments of the twelfth aspect of the present invention may comprise one or more features of any previous aspect of the present invention.

According to a yet further aspect of the present invention there is provided a method of displaying data representing behaviour of an electrical power network, the method comprising: receiving from each of plural different spaced apart locations in an electrical power network at least one signal representing behaviour at the location and more specifically oscillatory behaviour at the location; and displaying signals in dependence on the received signals. Embodiments of the yet further aspect of the present invention may comprise one or more features of any previous aspect of the present invention.

BRIEF DESCRIPTION OF DRAWINGS

Further features and advantages of the present invention will become apparent from the following specific description, which is given by way of example only and with reference to the accompanying drawings, in which.

DETAILED DESCRIPTION OF THE INVENTION

Figure 1:
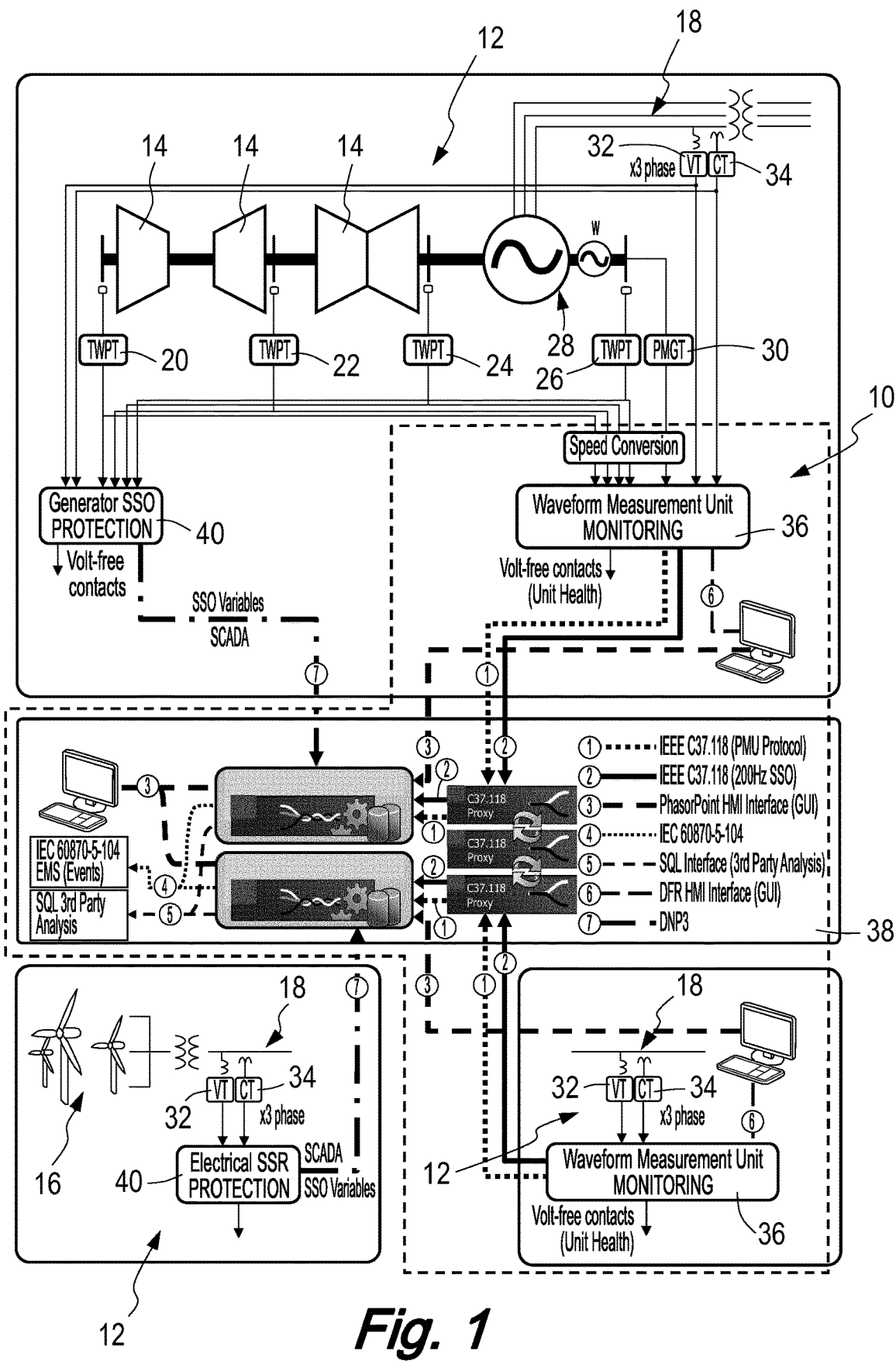
FIG. 1 is a representation of apparatus for monitoring oscillations according to an embodiment of the present invention.

Apparatus 10 for monitoring oscillations according to an embodiment of the present invention is shown in FIG. 1; the apparatus 10 is surrounded by the dashed line in FIG. 1. The apparatus 10 is operable to monitor an electrical power network 12. The electrical power network 12 comprises plural turbines 14, conventional generators 28 and renewable generators 16. The electrical power network 12 further comprises a three phase electrical network 18 comprising HVDC links which is fed by the plural turbines 14 and renewable generation 16. The part of the electrical power network 12 comprising the plural turbines 14 is shown towards the top of FIG. 1. The part of the electrical power network 12 comprising the renewable generation 16 is shown towards the lower left of FIG. 1. Another part of the electrical power network 12 is shown within the dashed line towards the lower right of FIG. 1. The apparatus 10 for monitoring oscillations comprises plural measurement arrangements. A first measurement arrangement 20 is a toothed wheel probe transducer which is operative to measure speed of rotation of the shaft of a first turbine 14. Second and third measurement arrangements 22, 24 are toothed wheel probe transducers which are operative to measure speed of rotation of shafts of second and third turbines 14 respectively. A fourth measurement arrangement 26 is a toothed wheel probe transducer which is operative to measure speed of rotation of a shaft of an alternator 28. A zebra tape measurement arrangement can be used instead of or in addition to a toothed wheel probe transducer.

In addition to measurements of shaft speed by toothed wheel probes and zebra tape, indirect approaches are used to identify oscillations relating to generator shaft speed. In generators fitted with a Permanent Magnet Generator (PMG), a current signal is extracted from the static part of the excitation system 30. From the repeating pattern of the excitation current and the deviations from the nominal period of the signal, a signal is derived that includes the oscillations in shaft speed. Another approach for measuring shaft speed dynamics is to apply a Field Search Coil (FSC) to the casing of generator, which measures the changes in magnetic field as the rotor winding passes under the FSC. The resulting signal also shows a repeating pattern from which shaft speed is derived. The benefits of an FSC measurement are that the technique is entirely non-invasive and that it measures the oscillations directly at the generator rotor, at a point on the shaft where other mechanical shaft speed measurements are not possible. Use of an FSC to measure rotor speed is described further in *External Search Coil as a Means of Measuring Rotor Speed of an Induction Motor*, H. B. Ertan and O. Keysan, Electromotion 2009—EPE Chapter "Electric Drives' Joint Symposium, 1-3 Jul. 2009, Lille, France. In both of these indirect approaches, the raw signal is processed to obtain a signal proportional to shaft speed, which is then provided to the downstream processes in the same way as other speed measurements from toothed wheel probes or zebra tape measurements.

The plural measurement arrangements further comprise plural voltage transformers 32 which are operative to measure voltage signals on each of three phases at each of plural different locations in the electrical network 18. The plural measurement arrangements yet further comprise plural current transformers 34 which are operative to measure current signals on each of three phases at each of plural different locations in the electrical network 18. Each measurement apparatus is configured in accordance with known practice to provide signals of an appropriate form for subsequent processing. For example each toothed wheel probe transducer and zebra tape measurement arrangement comprises a pulse width counter which is operative to convert pulse train measurements to an analogue signal proportional to speed of rotation.

The apparatus 10 for monitoring oscillations comprises plural waveform measurement apparatus 36 with each waveform measurement apparatus 36 being present at a respective one of the plural locations where measurements are made with voltage and current transformers 32, 34. The waveform measurement apparatus 36 comprises an Alstom Reason RPV311 digital fault recorder from Alstom Grid which is operative to continuously acquire output signals from the local voltage and current transformers 32, 34 at a sample rate of 12,800 Hz in a 50 Hz system. Each sample by a digital fault recorder is time stamped to provide for later alignment of plural data streams. Data recorded by each digital fault recorder is down-sampled to four samples per cycle of the fundamental frequency of the electrical power network 12. In the present embodiment the fundamental frequency is 50 Hz and hence the recorded data is down-sampled to 200 Hz. Where a speed measurement is made by way of a toothed wheel probe transducer or a zebra tape measurement arrangement, the speed measurement is also received in a digital fault recorder where it is time stamped and subject to down-sampling to four samples per cycle of the fundamental frequency. Thereafter the waveform measurement apparatus 36 is operative to perform various tests on the down-sampled data and to apply a transformation to the down-sampled data to reduce bandwidth requirements for onward transmission of data. The performing of the various tests and the application of the transformation are described further below.

Data is conveyed from each of the waveform measurement apparatus 36 to a central control room 38 in accordance with the IEEE C37.118 protocol for processing therein followed by display to a user. Processing and display of data received in the central control room 38 is described further below.

The arrangement shown in FIG. 1 comprises apparatus further to the apparatus 10 for monitoring oscillations and the parts of the electrical power network 12 identified above. SSR protection 40 in the form of tripping apparatus of known form and function is present at generation plant. More specifically SSR protection 40 is present at the turbines 14 and at the renewable generation 16. Outputs from the SSR protection 40 are conveyed to the central control room 38 in accordance with the DNP3 protocol.

Raw measurements from the power system are pre-processed to provide a consistent data stream to downstream oscillation analysis and display. Without such pre-processing, discontinuities and disturbances in the measured data can disrupt the analysis process and potentially introduce spurious notifications to the operator. Pre-processing also minimises gaps in the data available to the subsequent oscillation analysis and display by making use of the valid data available from the individual phases of the three-phase data. Furthermore, pre-processing reduces the volume of data to be communicated and stored through conversion to a single-phase representation. As described further below, pre-processing involves determining data quality flags that are raised and lowered depending on whether or not there is a fault in the power system in one or two phases and whether or not there is a failure apparent in one or two phase measurements. In addition, the Clarke transformation derived single-phase measurement output interchanges between derivation from three-phase, two-phase or single-phase in dependence on the quality of the data in the three measured phases, whereby the greatest continuity of data is obtained for the downstream processes.

To create the data quality flags, a buffer of three cycles is created between the incoming three-phase downsampled data and outgoing data for processing. Within this three-cycle buffer, validity flags are determined and applied to the data which are used by the downstream oscillation analysis process to manage data discontinuities, disturbances and measurement failure. More specifically, the downstream analysis processes treat the flagged data as a gap in valid data to be refilled without introducing spurious effects in the oscillation analysis results.

Figure 2:
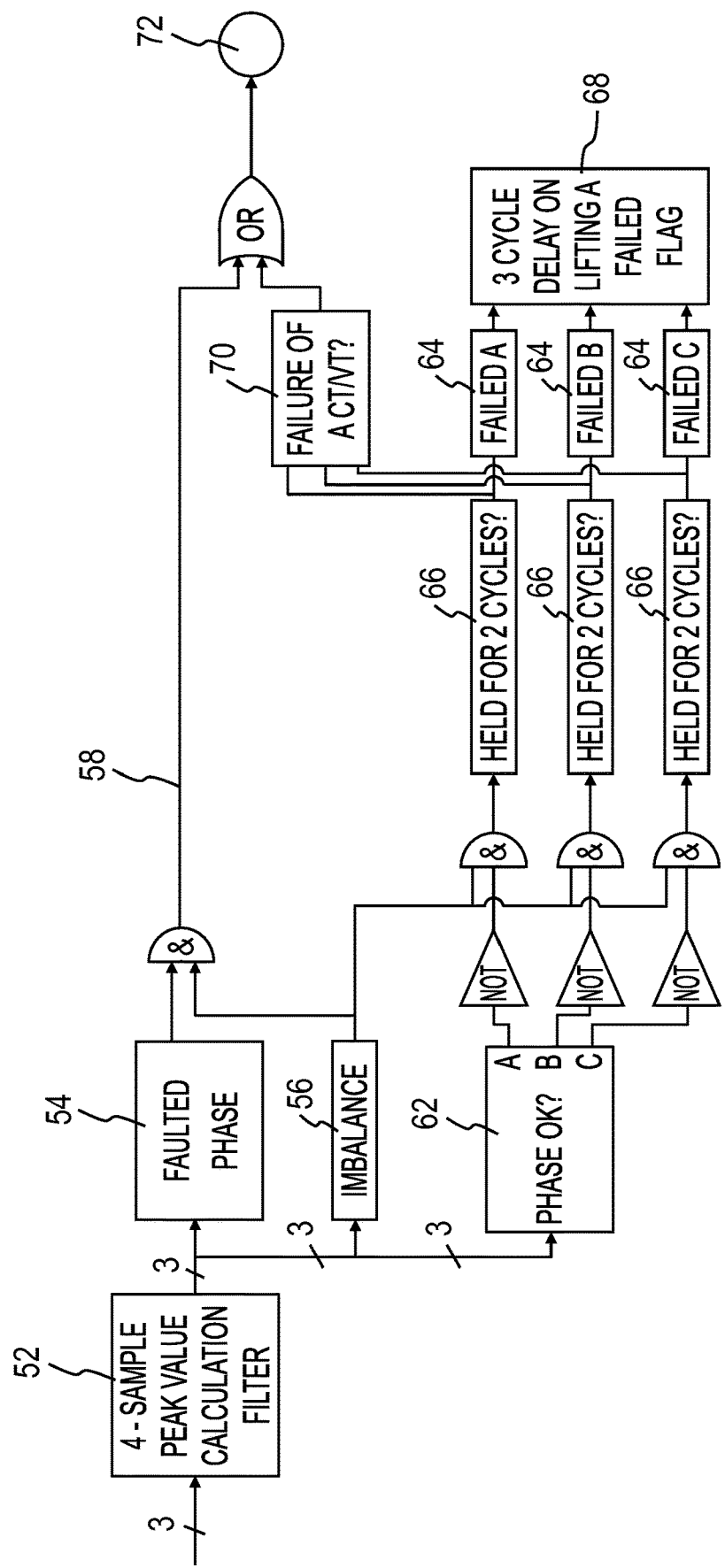
FIG. 2 represents measurement interruption detection according to an embodiment of the present invention.

The performing of various tests within each waveform measurement apparatus 36 will now be described. Measurement interruption testing is represented in FIG. 2. During processing of measured data, delays are introduced either as a consequence of a processing step or of themselves whereby phase switching and discontinuity of data occurs during a period of bad data. This avoids false detection of sub-synchronous oscillation. As a first step the down-sampled voltage and current data from each of the three phases is filtered to extract the peak value for each phase 52. The filter introduces a 1 cycle delay to the data. The first cycle of data is therefore marked as bad and ignored subsequently. The extracted peak values are used in the following measurement interruption tests. The object of the measurement interruption tests is to determine which sampled phase data is valid and should be acted upon and which sampled phase data is invalid and should therefore be ignored.

The first category of measurement interruption tests is fault detection. A fault may, for example, be caused by branch of a tree touching a line or by lightning. Fault detection is performed in respect of each of voltage and current. The general approach is the same for voltage and current data with a difference to take account of the different behaviour of voltage and current signals. It should be noted that the present fault detection approach is operative to detect asymmetric fault conditions only of asymmetric fault conditions and symmetric fault conditions. This is because there may be similarity in behaviour of the electrical power network between a symmetric fault condition and early stage sub-synchronous resonance in respect of the voltages of all three phases dropping to close to zero. Detection of a symmetric fault condition would run the risk of discarding of data which would otherwise reveal relevant oscillatory behaviour. Distinguishing between a symmetric fault condition and early stage sub-synchronous resonance is accomplished subsequently during data analysis in the central control room 38 through oscillation damping estimation. Data analysis in the central control room typically involves observation of data in a three to five minute time window and extraction of oscillation frequency, amplitude and damping. A symmetric fault is normally a short transient with a well damped oscillation ringdown response, whereas a sub-synchronous resonance event is normally a sustained oscillation characterised by raised amplitude and poor damping.

Fault detection for each of voltage and current comprises two tests: detection of phase fault 54 and detection of phase imbalance 56. The two tests for voltage and current will be considered in turn.

Phase fault detection 54 for voltage involves determining if peak voltage data has reduced by more than a predetermined amount over a predetermined period in respect of any one of the three phases. The predetermined amount is a user settable percentage of the nominal voltage, such as 20% of a nominal voltage of 132 kV. In the present embodiment the predetermined period is a cycle of the AC waveform. The phase fault detection test for voltage may therefore be expressed as:

Faulty Phase if Peak$V$ Phase$_{i_{present\ cycle}}$−Peak$V$ Phase$_{i_{previous\ cycle}}$<(−Threshold of Fault Detection Setting)*Nominal Voltage Detection of phase imbalance 56 for voltage involves determining whether or not a difference between a maximum peak value of the three voltage phases and a minimum peak value of the three voltage phases is greater than a predetermined value. The predetermined value is a user settable percentage of a nominal voltage of the AC waveform, such as 30% of a nominal voltage of 132 kV. The phase imbalance test for voltage may therefore be expressed as:

Imbalance Detection if Max Peak $V$−Min Peak $V$>Imbalance Tolerance Setting*Nominal Voltage A fault condition signal is generated 58 in respect of voltage when the phase fault detection test for any one of the phases and the phase imbalance test both fail. The fault condition signal is held for a predetermined period of 200 ms. A period of 200 ms is an appropriate length of time for clearing of a majority of faults. Detection of a fault condition involves up to a 1 cycle delay. The algorithm provides for a 2 cycle delay so as to provide for the same delay as failure condition processing which is described below. The first 4 cycles of initial voltage data are marked as bad data on account of the one cycle delay for the filters and the three cycle delay for phase measurements and are ignored to avoid faulty operation of the fault condition test algorithm during initialisation of the fault condition test algorithm. Irrespective of whether or not the two tests are passed or failed the three phase voltage samples are passed for transformation.

Turning now to current, phase fault detection 54 for current involves determining if peak current data has increased by more than a predetermined amount over a predetermined period in respect of any one of the three phases. The predetermined amount is a user settable percentage of the rated current, such as 20% of a rated current of 1.5 kA. In the present embodiment the predetermined period is a cycle of the AC waveform. The phase fault detection test for current may therefore be expressed as:

Faulty Phase if Peak $I$−Phase$_{i_{present\ cycle}}$−Peak$I$ Phase$_{i_{previous\ cycle}}$>Threshold of Fault Detection Setting*Rated Current Detection of phase imbalance 56 for current involves determining whether or not a difference between a maximum peak value of the three current phases and a minimum peak value of the three current phases is greater than a predetermined value, such as 30% of a rated current of 1.5 kA. The predetermined value is a user settable percentage of the rated current of the AC waveform. The phase imbalance test for current may therefore be expressed as:

Imbalance Detection if Max Peak $I$−Min Peak $I$>Imbalance Tolerance Setting*Rated Current As per voltage above, the fault condition signal is generated 58 in respect of current when the phase fault detection test for any one of the phases and the phase imbalance test for current both fail. The fault condition signal is held for a predetermined period of 200 ms. A period of 200 ms is an appropriate length of time to allow for clearing of a majority of faults. Detection of a fault condition involves up to a 1 cycle delay. The algorithm provides for a 2 cycle delay so as to provide for the same delay as failure condition processing which is described below.

The second category of measurement interruption tests is testing for measurement apparatus failure. Measurement apparatus failure testing is performed on sampled data for each of voltage and current. The approach is the same for voltage and current data.

Testing for measurement apparatus failure in respect of voltage involves testing for voltage transformer failure. The voltage transformer failure test comprises two tests: low peak voltage detection 62 and detection of phase imbalance 56. Determining whether or not there is a low peak voltage comprises determining whether or not peak voltage of each of three phases is greater than a predetermined value. Failure of up to two phases is detected and failure of all three phases is ignored. The predetermined value is a user settable percentage of the nominal voltage, such as 30% of a nominal voltage of 132 kV. The voltage transformer failure test may therefore be expressed as:

Phase$_{i\_OK}$ if Peak$V$ Phase$_i$>Healthy Voltage Threshold*Nominal Voltage

Detection of phase imbalance 56 for voltage is as described above. If both the low peak voltage detection test 62 fails in respect of a phase and the phase imbalance test 56 fails, a voltage transformer failure condition signal 64 is generated in respect of each corresponding phase. The voltage transformer failure condition signal 64 is confirmed if the failure determination persists for at least two cycles of the AC waveform 66 to thereby provide for certainty. Problems are thus avoided such as unnecessary phase switching during subsequent processing which might arise on account of a transient low electrical voltage. In addition if one or two but not three phases fail the low peak voltage detection test 62, an overall voltage transformer failure condition signal 70 is generated.

Testing for measurement apparatus failure 64 in respect of current involves testing for current transformer failure. The current transformer failure test comprises two tests: low peak current detection 62 and detection of unbalanced phases 56. Determining whether or not there is low peak current comprises determining whether or not peak current is greater than a predetermined value. The predetermined value is a user settable percentage of the rated current, such as 5% of a rated current of 1.5 kA. The current transformer failure test may therefore be expressed as:

Phase$_{i\_}$OK if Peak$V$ Phase$_i$>Healthy Current Threshold*Rated Current

Detection of unbalanced phases for current is as described above. If both the low peak current detection test 62 fails in respect of a phase and the phase imbalance test 56 fails, a current transformer failure condition signal 64 is generated in respect of each corresponding phase. The current transformer failure condition signal 64 is confirmed if the failure determination persists for at least two cycles of the AC waveform 66. The present two cycle delay is applied for consistency with the delay applied in respect of voltage despite current tending to recover from failure more quickly than voltage. In addition if one or two but not three phases fail the low peak current detection test 62, an overall current transformer failure condition signal 70 is generated.

A measurement interruption condition signal 72 is generated if either a fault condition signal 58 or an overall failure condition signal 70 is generated. As per the fault condition signal, the measurement interruption condition signal 72 is held for 200 ms.

On start up of the measurement stream, the first 4 cycles of initial current and voltage data are marked as bad data on account of the one cycle delay for the filters and the three cycle delay for phase measurements and are ignored to avoid faulty operation of the fault condition test algorithm during initialisation of the fault condition test algorithm. Irrespective of whether or not the two tests are passed or failed the three phase current samples are passed for transformation. Voltage and current transformers may recover following failure whereby measurements become valid again. Following recovery of a failed voltage or current transformer the three cycle delay is applied before measurements are passed for transformation. Providing this delay reduces the likelihood of discontinuities in data. During recovery the voltage or current transformer failure condition signal continues to be generated.

Following the above described fault detection phase sampled data is subject to transformation. The application of the transformation within each waveform measurement apparatus 36 will now be described. The transformation employed in the present embodiment is the Clarke transformation:

$$D_{\alpha\beta0}(t) = \frac{2}{3} \begin{bmatrix} 1 & -\frac{1}{2} & -\frac{1}{2} \\ 0 & \frac{\sqrt{3}}{2} & -\frac{\sqrt{3}}{2} \\ \frac{1}{2} & \frac{1}{2} & \frac{1}{2} \end{bmatrix} \begin{bmatrix} D_a(t) \\ D_b(t) \\ D_c(t) \end{bmatrix} \quad (1)$$

where D is either current (i.e. i) where the data subject to transformation relates to current measurements or voltage (i.e. v) where the data subject to transformation relates to voltage measurement.

The Clarke transformation is operative to generate a single phase representation of plural phases irrespective of whether data from two or three phases is available. Application of the Clarke transformation therefore reduces data without loss of observability of oscillatory behaviour whereby the reduced data may be more readily conveyed to the central control room 38 without undue delay or an undue bandwidth overhead. Where only data for one phase is available there is no transformation and the data is conveyed as described above to the central control room 38. Both valid data and bad data are subject to transformation. To provide for phase switching and discontinuity to take place during a bad data period, real time samples operated on by the Clarke transformation are delayed by three cycles. One cycle of the three cycle delay is required to take account of filtering to determine the peak values. Two cycles of the three cycle delay are required to allow for detection of voltage or current transformer failure. Bad data is subject to a two cycle delay to reduce the risk of a bad data period finishing before a fault is cleared. If the number of valid phase measurements changes, for example on account of voltage or current transformer recovery, a bad data signal is generated for 200 ms to take account of phase switching.

Where data for two phases is subject to transformation, the β transformation of the following Clarke transformation is applied. Where there is a change in valid phase measurements as determined by the tests described above, the two phases applied to the transformation are changed accordingly. The β transformation has the form:

$$D_\beta(t) = \frac{2}{3} \begin{bmatrix} \frac{\sqrt{3}}{2} & -\frac{\sqrt{3}}{2} \end{bmatrix} \begin{bmatrix} D_a(t) \\ D_b(t) \end{bmatrix} \quad (1)$$

where D is either current (i.e. i) where the data subject to transformation relates to current measurements or voltage (i.e. v) where the data subject to transformation relates to voltage measurement. This transformation applies where phases a and b are transformed. Where phases b and c or phases c and a are transformed the latter part of the matrix multiplication is respectively:

$$\begin{bmatrix} D_b(t) \\ D_c(t) \end{bmatrix} \begin{bmatrix} D_c(t) \\ D_a(t) \end{bmatrix}$$

Where data for three phases is subject to transformation, the α transformation of the Clarke transformation is applied. The α transformation has the form:

$$D_\alpha(t) = \frac{2}{3} \begin{bmatrix} 1 & -\frac{1}{2} & -\frac{1}{2} \end{bmatrix} \begin{bmatrix} D_a(t) \\ D_b(t) \\ D_c(t) \end{bmatrix} \quad (2)$$

where D is either current (i.e. i) where the data subject to transformation relates to current measurements or voltage (i.e. v) where the data subject to transformation relates to voltage measurement.

Figure 3A:
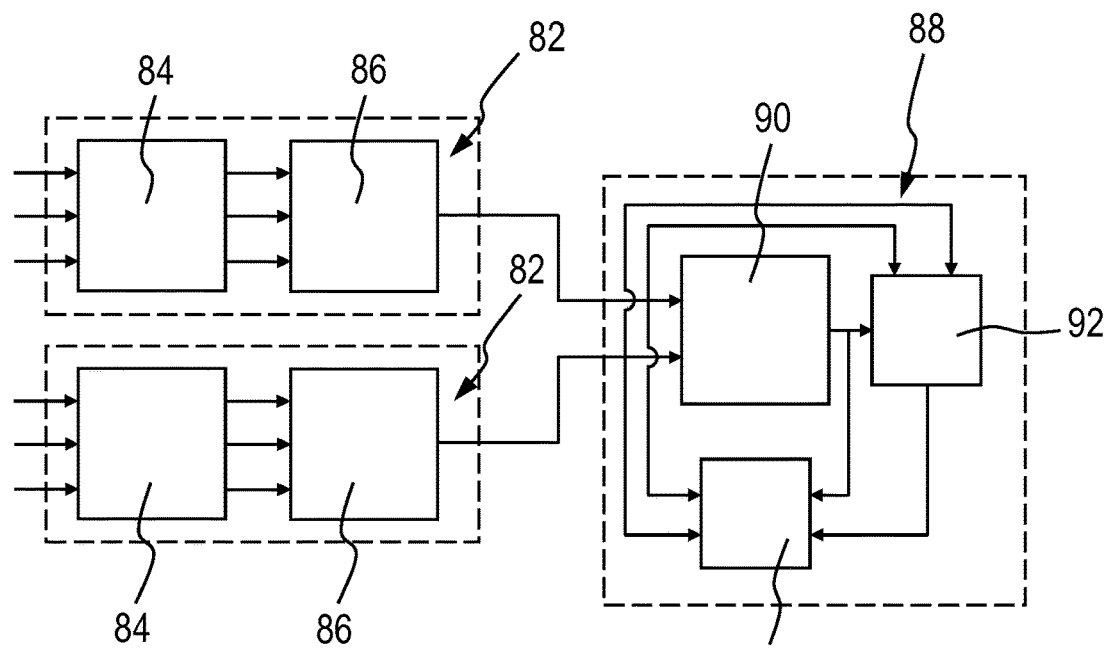
FIG. 3A is a representation of a first embodiment in which the Clarke transformation is applied on a distributed basis.

A representation of a first embodiment in which the Clarke transformation is applied on a distributed basis is shown in FIG. 3A. The first embodiment comprises plural substations 82. Each substation 82 comprises apparatus 84 which is configured to filter and down-sample three phase voltage and current measurements as described above. Each substation 82 further comprises apparatus 86 which is configured to apply the Clarke transformation to filtered and down-sample data as described above. The first embodiment yet further comprises a central control room 88 which receives transformed data from each of the substations 82. Application of the transformation at each of the substations 82 reduces data volume whereby onward transmission of the data to the central control room 88 is more readily accomplished, for example, in view of limited communication bandwidth between the substations 82 and the central control room 88. The central control room 88 comprises analysis apparatus 90 configured for frequency domain analysis of the received transformed data, display and output apparatus 92 for displaying analysed data and transformed measurement data and providing alarms in dependence on the analysis and data storage 94 for storing received transformed data and the results of analysis performed by the analysis apparatus 90. Application of the transformation has the further benefit of reducing data storage requirements in respect of the data storage 94 and simpler visualisation by way of the display and output apparatus 92.

Figure 3B:
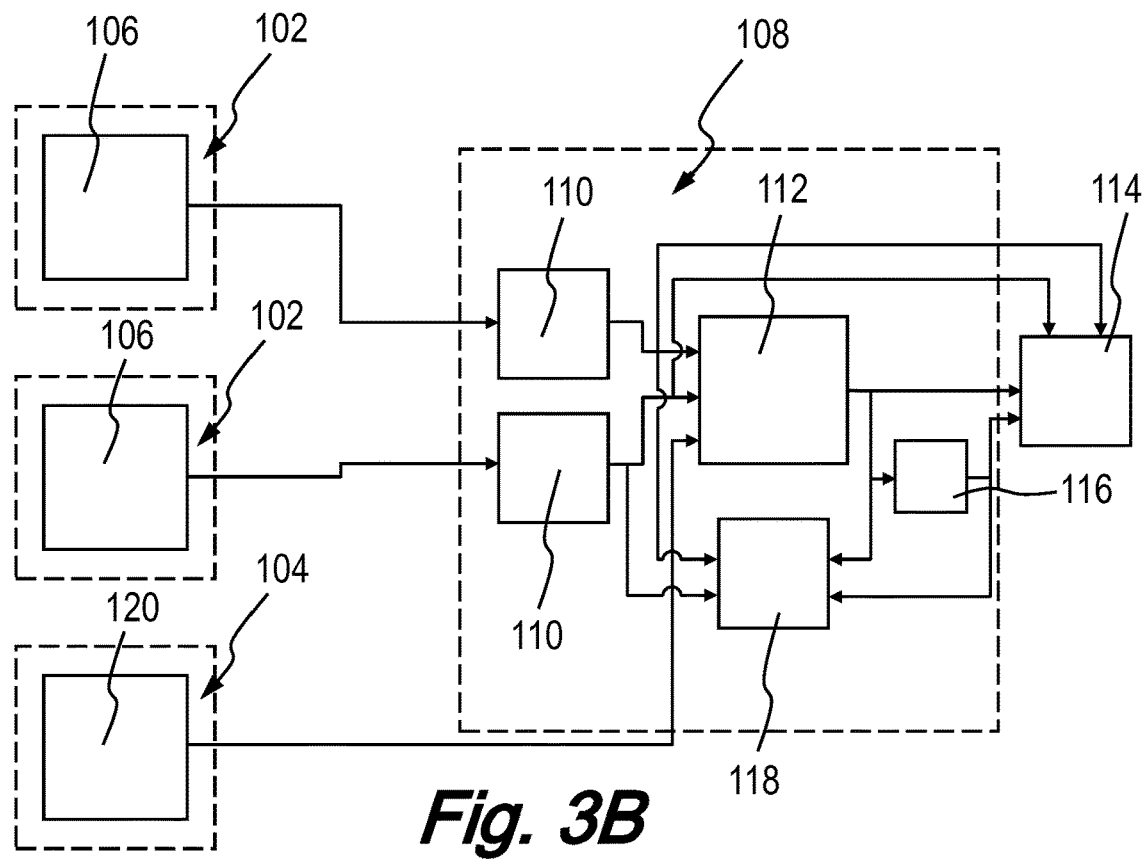
FIG. 3B is a representation of a second embodiment in which the Clarke transformation is applied on a centralised basis.

A representation of a second embodiment in which the Clarke transformation is applied on a centralised basis is shown in FIG. 3B. The second embodiment comprises plural substations 102, 104. Each of two of the substations 102 comprises apparatus 106 which is configured to filter and down-sample three phase voltage and current measurements as described above. The second embodiment yet further comprises a central control room 108 which receives the thus processed measurement data from the substations 102. The central control room 108 is configured to apply the Clarke transformation 110 to the processed measurement data received from the substations 102. The central control room 108 comprises analysis apparatus 112 configured for frequency domain analysis of the transformed data, display apparatus 114 for displaying analysed data and transformed measurement data, output apparatus 116 for providing alarms in dependence on analysis and data storage 118 for storing received transformed data, the results of analysis performed by the analysis apparatus 112 and alarms output by the output apparatus 116. Application of the Clarke transformation according to the second embodiment reduces storage demands on the data storage 118 and provides for simpler visualisation by way of the display apparatus 114. The second embodiment yet further comprises a third substation 104 which comprises single phase measurement processing apparatus 120. The single phase measurements from the third substation 104 are communicated directly to the analysis apparatus 112 in view of the Clarke transformation being inoperative in respect of one phase only.

Processing and display of data received in the central control room 38, 88, 108 of FIGS. 1,3A and 3B will now be described.

Figure 4:
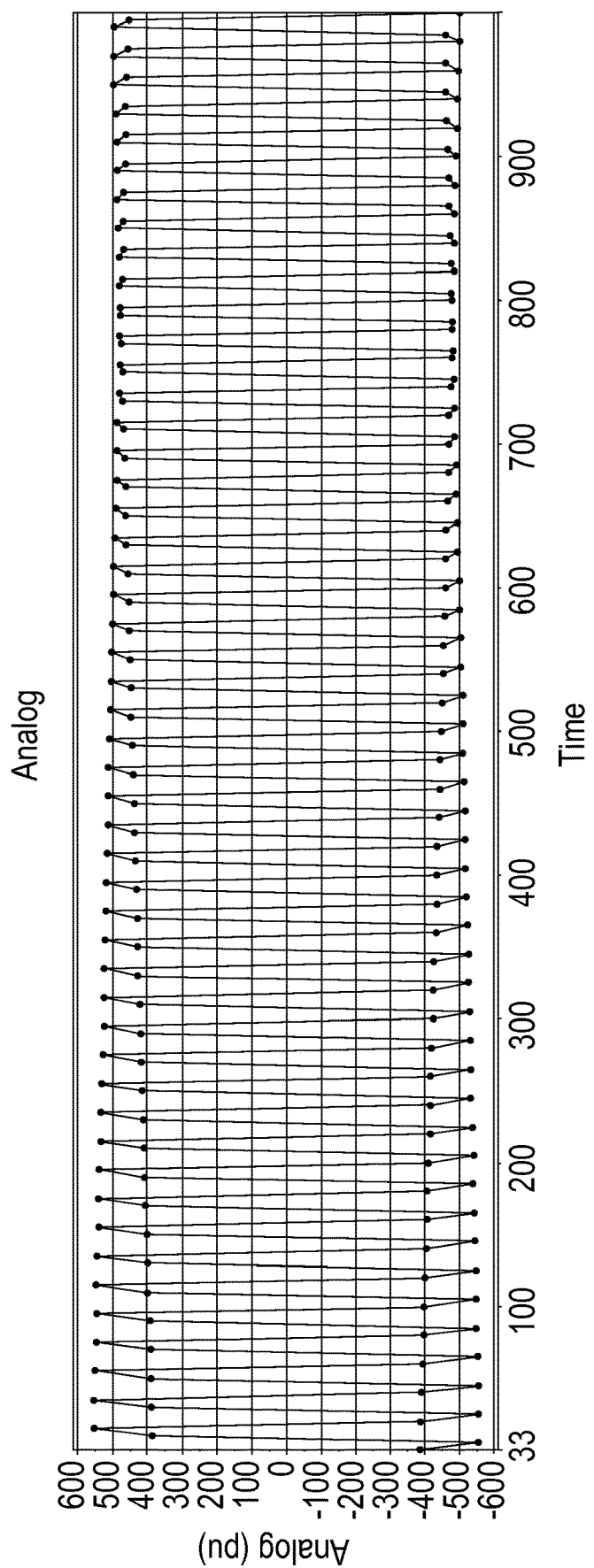
FIG. 4 shows an analogue voltage or current signal.
Figure 5:
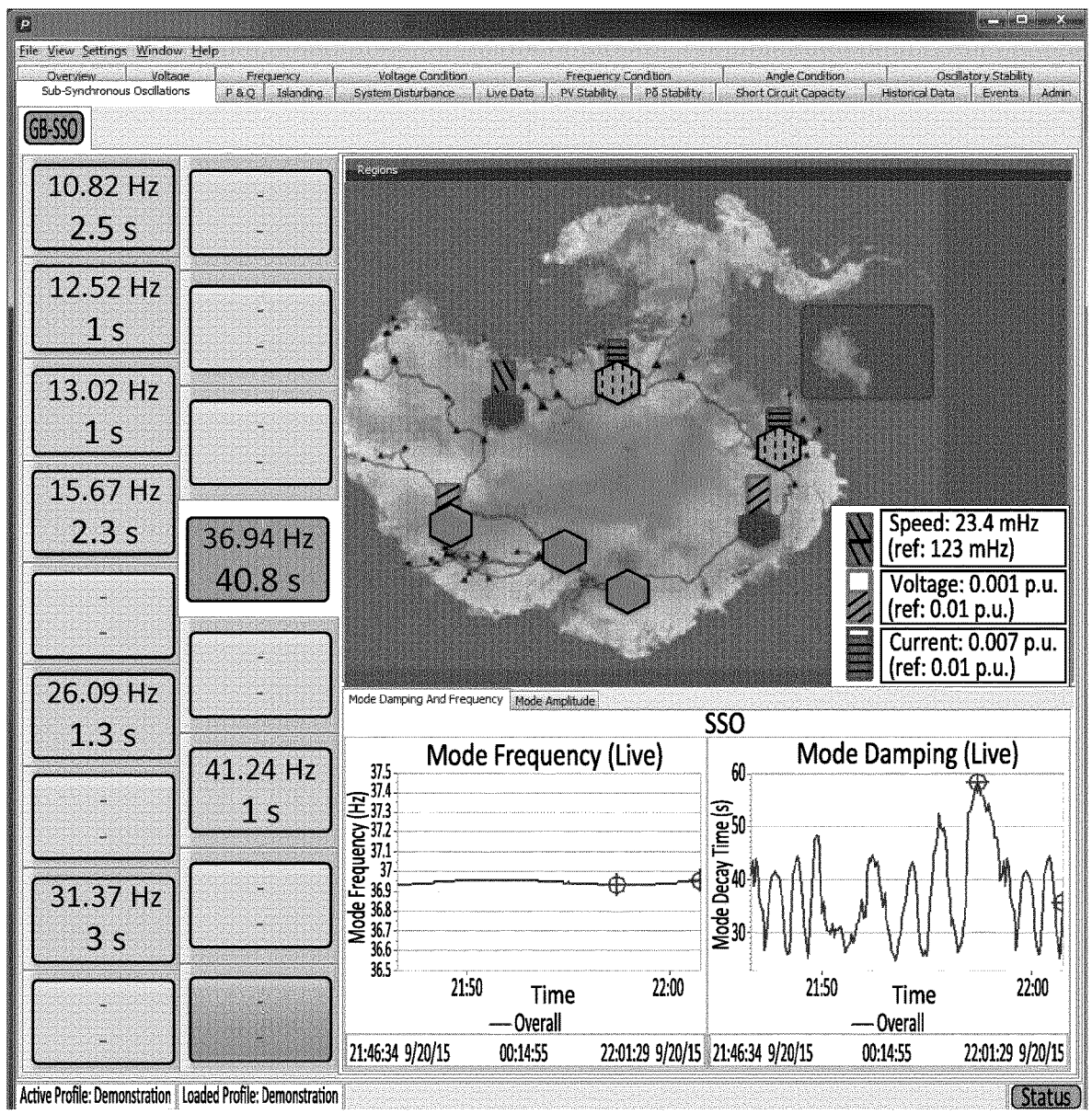
FIG. 5 shows an image from a video display unit which represents Antarctica and a fictional electrical power network located there.

FIG. 4 shows an analogue voltage or current signal along with data sample points as per operation of measurement apparatus comprised in the substations 82, 102 of FIGS. 3A and 3B. Thereafter sampled data is processed and transformed as described above with reference to FIGS. 3A and 3B before being communicated to the central control room 38, 88, 108. After processing of data received in the central control room 38, 88, 108 in accordance with the processes described below, a representation of the electrical power network is shown on a video display unit, such as forms part of a workstation. The electrical power network is displayed in the form of a map which shows natural features of the geographical area of the electrical power network. FIG. 5 contains an image from a video display unit which shows Antarctica and a fictional electrical power network located there. As can be seen from FIG. 5, the electrical power network comprises a main loop having seven spaced apart locations, which are each designated by way of a hexagonal indicator, at which at least one of voltage, current and speed are measured as described above. The colour of a hexagonal indicator indicates the status at the location: green (the lighter colour of FIG. 5) indicates normal status; yellow (the lighter colour of FIG. 5 with vertical dashes) indicates alert status; and red (the darker colour of FIG. 5) indicates alarm status. As can be seen from FIG. 5, the three indicators in the south of the island are in normal state. The next indicator in a clockwise direction around the loop is in alarm state and the next indicator in an anti-clockwise direction around the loop is also in alarm state. The remaining two indicators towards the north east of the island are in alert state.

As can be seen from FIG. 5, a vertical bar extends from each of the indicators in alert and alarm state and the western-most indicator in normal state. Each vertical bar represents by way of its length the magnitude of oscillation in voltage, frequency or speed depending on availability of such measurements at each location, processing as described below and selection by a user. Considering FIG. 5 further, the western-most indicator in normal state has a bar of moderate length with diagonal lines which extend upwards from left to right and which indicates magnitude of oscillation in voltage. The western indicator in alarm state has a bar of greater length with diagonal lines which extend downwards from left to right and which indicates magnitude of oscillation in speed. The eastern indicator in alarm state has a bar of greater length with diagonal lines which extend upwards from left to right and which indicates magnitude of oscillation in voltage. Each of the two indicators in alert state towards the north east has a bar of moderate length with horizontal lines and which indicates magnitude of oscillation in current. When an indicator is in alert or alarm state a user is able to see which measurements have crossed a threshold at various locations and the extent of oscillation at various locations to thereby determine which locations and hence plant are involved in oscillatory behaviour. Where multiple data sources are available at one location, the software automatically selects the most significant measurement to display according to alarm state and normalised amplitude. A user may also explicitly select and view the time-history of oscillation amplitude from a given value.

The various detected mode frequencies are shown towards the left-hand side of the display of FIG. 5. When a mode box towards the left-hand side of the display is clicked the geographic view and the charts related to the selected mode of oscillation are displayed. Each mode box also shows the damping of the mode by way of decay time constant and alarm state as reflected by the colour of the box. Each mode box is of a colour which indicates status in the same manner as the hexagonal indicators described above with green indicating normal status, yellow indicating alert status and red indicating alarm status.

Figure 6:
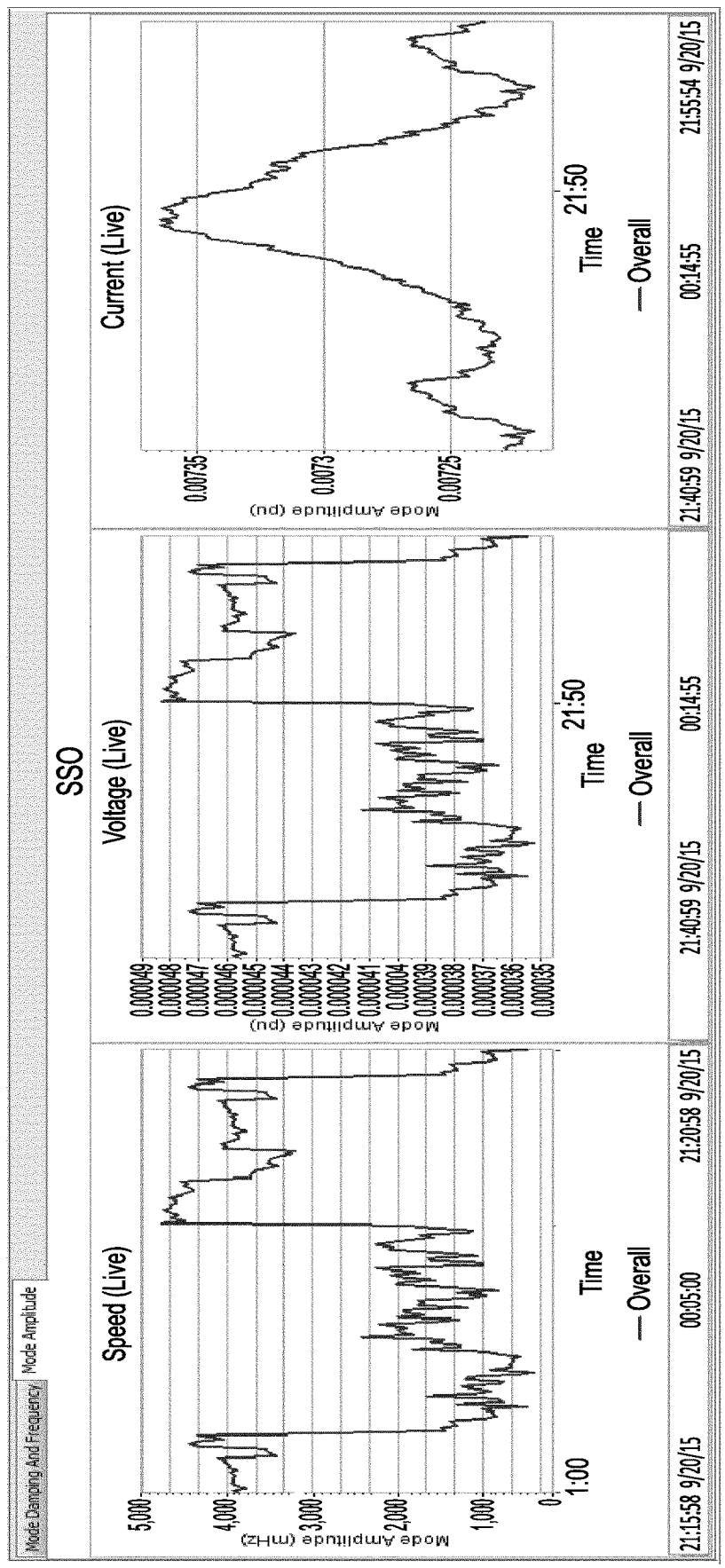
FIG. 6 shows mode amplitude charts for subsynchronous oscillations.

As can be seen from the bottom of the display shown in FIG. 5, the left hand chart shows the mode frequency of subsynchronous oscillations over a period of fourteen minutes and fifty-five seconds. The right hand chart at the bottom of the display shows the mode damping of subsynchronous oscillations over the same period. Alternatively the user may show the mode amplitude of subsynchronous oscillations over the same period by clicking the appropriate tab above the two charts shown in FIG. 5. FIG. 6 shows such mode amplitude charts. The left hand chart in FIG. 6 shows speed amplitude of subsynchronous oscillations over a five minute period. The middle chart in FIG. 6 shows voltage amplitude of subsynchronous oscillations over a period of fourteen minutes and fifty-five seconds. The right hand chart in FIG. 6 shows current amplitude of sub synchronous oscillations over a period of fourteen minutes and fifty-five seconds. Data for subsynchronous oscillations is obtained in dependence on operation of the analysis apparatus 90, 112 of FIGS. 3A and 3B. The analysis apparatus is operative in accordance with the approach to detecting SSO frequencies described in *Detection of Subsynchronous Torsional Oscillation Frequencies Using Phasor Measurement*, Tuomas Rauhala et al., IEEE Transactions on Power Delivery, Vol. PP, Issue 99, 22 May 2015.

Figure 7:
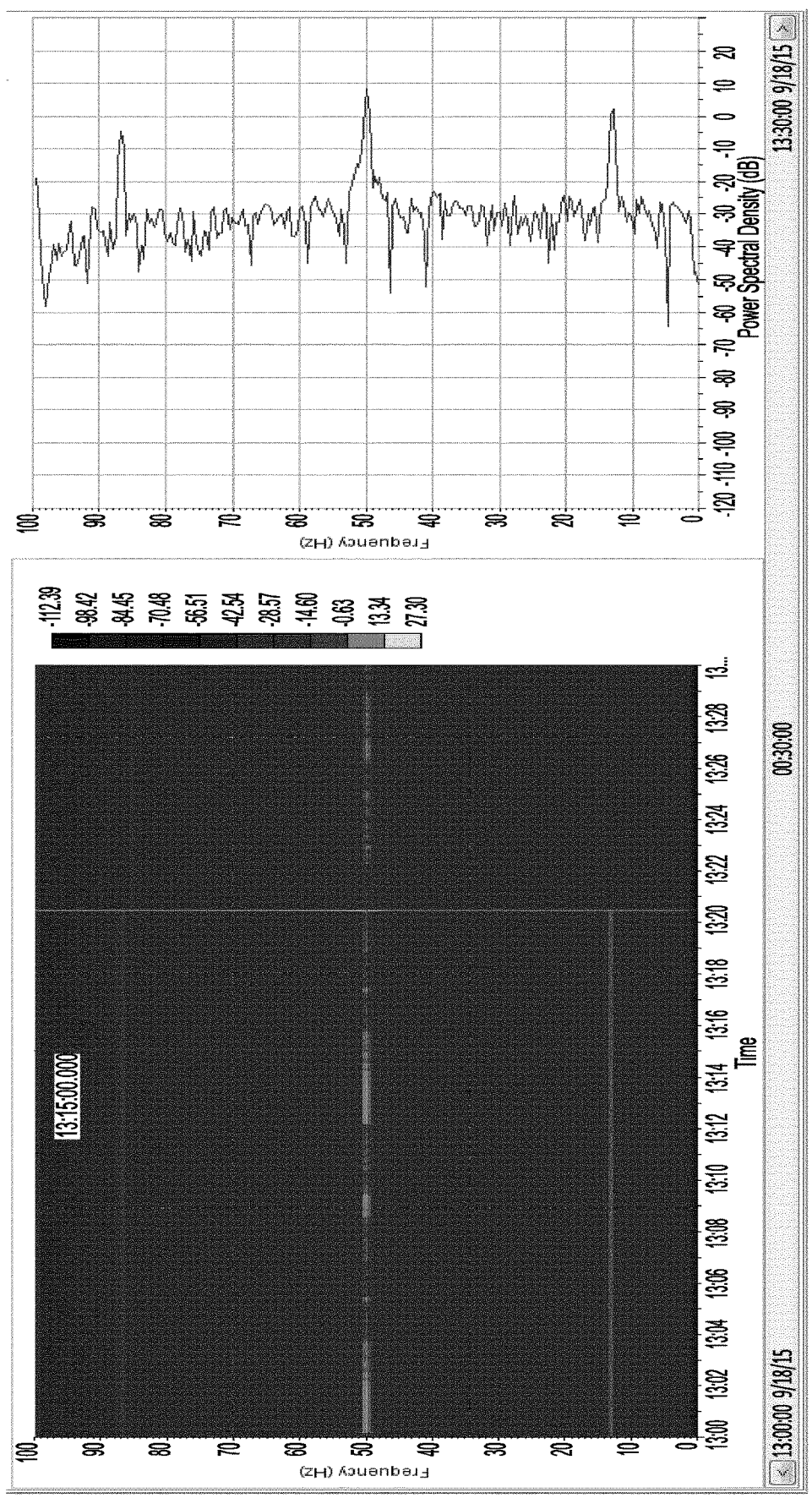
FIG. 7 shows a spectrogram of subsynchronous oscillations.

As described above, all measurement data received in the central control room 38, 88, 108 is stored. A user therefore can also display historical data for retrospective analysis of oscillatory behaviour. The process also comprises determining a spectrogram of subsynchronous oscillations based on measured data in the 4 Hz to 46 Hz bandwidth in a 50 Hz system and 4 Hz to 56 Hz in a 60 Hz system and displaying the spectrogram on a video display unit. FIG. 7 shows such a spectrogram. The spectrogram shows the amplitude of oscillations across the analysed frequency range over a period of time which, in the present case, is thirty minutes. Brighter colours reflect larger amplitude whereby an oscillation present over a period of time appears as a horizontal line of brighter colour according to the colour key at the right of the spectrogram. The right hand chart shows frequency against Power Spectral Density (PSD) related to a specific point in time selected using a cursor placed on the spectrogram. The chart also shows reflections of the oscillation frequencies around the fundamental frequency, which if present can be used to interpret whether the oscillation is a modulation or an addition to the fundamental frequency.

Turning now to the processing of data prior to display, one process involves prioritisation of a type of signal over other types of signal. Where there is prioritisation, at least two different types of signal are processed, i.e. at least two of voltage, current and rotational speed of an electrical machine. The processor is operative to accord a rotational speed signal higher priority than a voltage signal and to accord a voltage signal higher priority than a current signal. Following prioritisation, oscillation of a prioritised type of signal, such as rotational speed, is displayed in preference to oscillation of another type of signal, such as voltage, by displaying both oscillations at the same time but with the prioritised type of signal given greater prominence such as by way of use of colour or by locating the prioritised type of signal on the display to the left of the type of signal of lesser priority. The oscillations are subject to prioritisation and displayed following the steps described above, i.e. measurement, application of the Clarke transformation and SSO analysis, amongst other things. An alternative approach involves the processor selecting the prioritised type of signal and displaying oscillation of the prioritised type of signal only of the different available types of signal. Thus the type of signal that is more or most likely to provide insight to a user as to the nature of oscillatory behaviour is displayed and without his intervention. A user may intervene to display a type of signal of lesser priority should he wish to do so. The process is user configurable regarding prioritisation and preferential display in respect of the whole of the electrical network or a part of the electrical network.

Another process involves determining oscillation of largest amplitude at a location where there are plural measurements of the same type of signal, such as plural oscillations in speed. The processor is operative to compare the plural measured oscillations and to determine the oscillation of largest amplitude. Thereafter the oscillation of largest amplitude is displayed at the location in question.

Another process involves comparing an oscillation with a threshold value and if the oscillation is larger than the threshold value displaying the oscillation. This process is performed in respect of all locations shown on the display whereby a user's attention is drawn to those locations where oscillations are largest. Furthermore the threshold value is user settable whereby the user can, for example, view oscillatory behaviour at a larger subset of locations which are exhibiting moderate oscillatory behaviour before focusing on behaviour at a smaller subset of locations which are exhibiting more extreme oscillatory behaviour.

Another process involves normalisation of oscillation amplitude. The user sets a threshold value for a type of signal, such as oscillation in voltage. Thereafter the process involves comparing plural oscillations of this type of signal from plural locations and determining the oscillation of greatest amplitude. The oscillation of greatest amplitude is then compared with the threshold value. If oscillation of greatest amplitude is greater than the threshold value the plural oscillations are each normalised for display to the oscillation of greatest amplitude. If the oscillation of greatest amplitude is less than the threshold value the plural oscillations are each normalised to the threshold value.

Another process involves determining a complement for a frequency of oscillation in a particular type of signal. The complement is determined in respect of measurements from plural locations by subtracting the frequency of oscillation from the fundamental frequency for the electrical power network. Where a frequency of oscillation is in respect of an electrical signal, such as frequency of oscillation in voltage, the complement is used to provide for alignment with the same mode of oscillation in a mechanical measurement, such as frequency of oscillation in speed. The process further comprises displaying data corresponding to thus determined complements for appropriate signals. The ability to view the complement may be useful to a user in assessing behaviour of the electrical power network. The process involves one of: selection for display between oscillation frequency and the complement of the oscillation frequency; and display of one of electrical oscillation frequency and mechanical oscillation frequency along with the complement of the other of electrical oscillation frequency and mechanical oscillation frequency. For example the user may switch between the complement of frequency of oscillation based on voltage measurements and frequency of oscillation based on voltage measurements. By way of another example the user may select for display the complement of frequency of oscillation based on voltage measurements alongside frequency of oscillation based on rotational speed measurements.

Based on the data displayed as described above, a user is able to arrive at a conclusion concerning the nature of the oscillatory behaviour, such as the dominant oscillation component in respect of signal type, the locations of interacting elements, the path taken by oscillations through the electrical power network and the like. Appropriate action can then be taken by the user such as changing compensation level of series capacitors, reconfiguring the electrical power network to avoid interaction, generation re-dispatch and the like.

The invention claimed is:

1. A method of monitoring oscillations that are liable to interact in an electrical power network, in dependence on measurement of AC waveforms in the electrical power network, the method comprising:
   receiving first waveform data corresponding to an electrical quantity in each phase of at least two phases of three-phase AC waveforms at a location in the electrical power network;
   subsequent to the receiving, determining whether or not there is a measurement interruption, the measurement interruption indicative that some of the first measurement data is invalid, and ignoring the invalid first measurement data;
   applying a transformation to at least some of the first waveform data to provide therefrom second waveform data corresponding to an electrical quantity at the location in a single phase representation, the second waveform data depending on the at least two phases;
   subsequent to the applying, sending the second waveform data to a control center;
   analyzing the second waveform data at the control center for the presence of sub-synchronous oscillations, the sub-synchronous oscillations potentially interacting to create an adverse resonant condition in the electrical power network;
   based upon the analyzing, taking an action that addresses or prevents the adverse resonant condition in the electrical power network, the action being one of: changing a parameter of an element in the electrical power network or reconfiguring the electrical power network.

2. The method according to claim 1, in which the transformation is operative to project data for the at least two phases from a three-phase coordinate system onto a two axes reference frame.

3. The method according to claim 1, in which the transformation is the Clarke transformation.

4. The method according to claim 1, in which the step of receiving first waveform data comprises receiving first waveform data corresponding to an electrical quantity in each phase of three phases of three-phase AC waveforms at the location in the electrical power network and the transformation is operative on the first waveform data corresponding to an electrical quantity in each phase of the three phases to provide second waveform data corresponding to an electrical quantity in one phase only.

5. The method according to claim 1, in which the transformation is the Clarke transformation and three phases are subject to transformation, the transformation having the form:

$$D_\alpha(t) = \frac{2}{3}\begin{bmatrix} 1 & -\frac{1}{2} & -\frac{1}{2} \end{bmatrix}\begin{bmatrix} D_a(t) \\ D_b(t) \\ D_c(t) \end{bmatrix}$$

where D is either current where current is measured, or voltage where voltage is measured.

6. The method according to claim 1, in which the transformation is the Clarke transformation and two phases only are subject to transformation, the transformation having the form:

$$D_\beta(t) = \frac{2}{3}\begin{bmatrix} \frac{\sqrt{3}}{2} & -\frac{\sqrt{3}}{2} \end{bmatrix}\begin{bmatrix} D_a(t) \\ D_b(t) \end{bmatrix}$$

where D is either current where current is measured, or voltage where voltage is measured.

7. The method according to claim 1, in which determining whether or not there is a measurement interruption comprises determining a peak value for each of at least one phase of AC waveforms.

8. The method according to claim 1, further comprising determining whether or not there is a fault condition reflected in the first waveform data.

9. The method according to claim 8, in which determining whether or not there is a fault condition comprises determining whether or not there is an asymmetric fault condition, only of an asymmetric fault condition and a symmetric fault condition.

10. The method according to claim 8, in which determining whether or not there is a fault condition further comprises determining whether or not a phase is faulty.

11. The method according to claim 10, in which determining whether or not a phase is faulty comprises determining if the peak value for each of the at least two phases of three-phase AC waveforms has changed by more than a predetermined amount over a predetermined period.

12. The method according to claim 8, in which determining whether or not there is a fault condition further comprises determining whether or not plural phases are unbalanced.

13. The method according to claim 12, in which determining whether or not plural phases are unbalanced comprises determining whether or not a difference between a maximum peak value of the plural phases and a minimum peak value of the plural phases is greater than a predetermined value.

14. The method according to claim 1, further comprising generating a fault condition signal in dependence on determination of there being a fault condition, the fault condition signal being generated for a predetermined period.

15. The method according to claim 1, further comprising determining whether or not there is a failure condition reflected in the first waveform data.

16. The method according to claim 15, in which determining whether or not there is a failure condition comprises determining whether or not there is a low peak electrical quantity, determining whether or not there is a low peak electrical quantity comprising determining whether or not a peak value is greater than a predetermined value.

17. The method according to claim 16, in which a determination that there is a failure condition depends on a determination that there is a low peak electrical quantity and a determination that plural phases are unbalanced.

18. The method according to claim 15, in which a failure condition signal is generated in dependence on a determination of a failure condition, the failure condition signal being generated when the determination persists for at least two cycles of the AC waveform.

19. The method according to claim 1, in which there is a delay following recovery from a failure condition of a predetermined period before application of the transformation to the first waveform data.

20. The method according to claim 1, in which the step of receiving first waveform data comprises receiving the first waveform data at each of plural spaced apart locations in the electrical power network and the step of applying a transformation comprises applying a transformation to the first waveform data to provide therefrom second waveform data corresponding to an electrical quantity in a single phase representation at each of the plural spaced apart locations.

21. The method according to claim 1, further comprising processing the second waveform data to characterise behaviour of the electrical power network.

22. The method according to claim 1, further comprising determining time-varying data in dependence on the second waveform data, the time-varying data corresponding to at least one of frequency, amplitude and damping of oscillations.

23. The method according to claim 21, in which processing the second waveform data comprises identifying an interaction between at least two systems each having modes of oscillation which interact through the electrical power network to form resonance in dependence on comparison of time-varying data derived from measurement of different electrical quantities at plural locations in the electrical power network.

24. The method according to claim 1, further comprising receiving generator rotor speed data measured at a location in the electrical power network and processing the generator rotor speed data to derive at least one time-varying characteristic of the electrical power network, the at least one time-varying characteristic being received together with time-varying data based on the second waveform data.

25. The method according to claim 1, further comprising receiving waveform data acquired at the location in the electrical power network and down-sampling the received waveform data, the first waveform data corresponding to the down-sampled waveform data.

26. The method according to claim 25, in which the waveform data acquired at the location in the electrical power network is sampled at a rate of at least 1 kHz and down-sampling is to a rate of at least two samples per cycle of an AC waveform of the electrical power network.

27. The method according to claim 1, further comprising determining a spectrogram based on the second waveform data.

28. A computer program comprising program instructions for causing a computer to perform the method according to claim 1.

29. The computer program according to claim 28, which is one of: embodied on a record medium; embodied in a read only memory; stored in a computer memory; and carried on an electrical carrier signal.

30. Apparatus for monitoring oscillations that are liable to interact in an electrical power network, in dependence on measurement of AC waveforms in the electrical power network, the apparatus comprising a processor which is operative: to receive first waveform data corresponding to an electrical quantity in each phase of at least two phases of three-phase AC waveforms at a location in the electrical power network; subsequent to receiving the first waveform, to determine whether or not there is a measurement interruption, the measurement interruption indicative that some of the first measurement data is invalid, and ignoring the invalid first measurement data; to apply a transformation to the first waveform data to provide therefrom second waveform data corresponding to an electrical quantity in a single phase representation at the location, the second waveform data depending on the at least two phases; subsequent to the applying the transformation, to send the second waveform data to a control center; to analyze the second waveform data at the control center for the presence of sub-synchronous oscillations, the sub-synchronous oscillations potentially interacting to create an adverse resonant condition in the electrical power network;

wherein based upon the analyzing, an action is taken that addresses or prevents the adverse resonant condition in the electrical power network, the action being one of: changing a parameter of an element in the electrical power network or reconfiguring the electrical power network.

31. The apparatus for monitoring oscillations according to claim 30, further comprising a measurement apparatus which is operative to measure each phase of at least two phases of three-phase AC waveforms at the location in the electrical power network, the first waveform data corresponding to the measurements made by the measurement apparatus.

\* \* \* \* \*